(12) United States Patent
Minami et al.

(10) Patent No.: US 7,572,093 B2
(45) Date of Patent: Aug. 11, 2009

(54) TRANSPORT APPARATUS, CONTROL METHOD FOR THE SAME, AND VACUUM PROCESSING SYSTEM

(75) Inventors: Hirofumi Minami, Chigasaki (JP); Kenji Ago, Chigasaki (JP); Takafumi Kawaguchi, Chigasaki (JP); Toshio Koike, Chigasaki (JP); Junpei Yuyama, Chigasaki (JP)

(73) Assignee: ULVAC Inc., Chigasaki-Shi (JP)

( * ) Notice: Subject to any disclaimer, the term of this patent is extended or adjusted under 35 U.S.C. 154(b) by 0 days.

(21) Appl. No.: 11/095,649

(22) Filed: Apr. 1, 2005

(65) Prior Publication Data
US 2005/0232744 A1 Oct. 20, 2005

(30) Foreign Application Priority Data
Apr. 2, 2004 (JP) ............... 2004-109683

(51) Int. Cl.
*B25J 18/02* (2006.01)
(52) U.S. Cl. .................. 414/744.5; 74/490.01; 901/15
(58) Field of Classification Search ............. 414/744.5; 901/15, 28, 29; 74/490.05, 490.06, 490.01
See application file for complete search history.

(56) References Cited

U.S. PATENT DOCUMENTS

| | | | | |
|---|---|---|---|---|
| 3,204,115 A | | 8/1965 | Parmenter | |
| 5,789,878 A | * | 8/1998 | Kroeker et al. | 318/45 |
| 5,857,826 A | * | 1/1999 | Sato et al. | 414/744.6 |
| 5,899,658 A | * | 5/1999 | Hofmeister | 414/744.5 |
| 5,954,840 A | * | 9/1999 | Genov et al. | 414/744.5 |
| 6,299,404 B1 | * | 10/2001 | Muka et al. | 414/744.5 |
| 6,464,448 B1 | * | 10/2002 | Ha | 414/744.5 |
| 2001/0033788 A1 | * | 10/2001 | Pietrantonio | 414/744.5 |
| 2002/0048502 A1 | | 4/2002 | Minami et al. | |

FOREIGN PATENT DOCUMENTS

JP 2002-200584 7/2002

* cited by examiner

*Primary Examiner*—Donald Underwood
(74) *Attorney, Agent, or Firm*—Kratz, Quintos & Hanson, LLP

(57) ABSTRACT

A transport apparatus includes first and second linkages. The first linkage includes first and third arms that can be rotated around a coaxial rotary shaft of first through third driving shafts coaxially arranged, and transports a first carrier. The second linkage includes a second arm and the third arm that can be rotated around the coaxial rotary shaft of the first through third driving shafts, and transports a second carrier. The first and second linkages are arranged to allow the first and second carriers to move beyond the coaxial rotary shaft of the first through third driving shafts without interfering with each other.

13 Claims, 14 Drawing Sheets

TRANSPORT APPARATUS, CONTROL METHOD FOR THE SAME, AND VACUUM PROCESSING SYSTEM

BACKGROUND OF THE INVENTION

1. Field of the Invention

The present invention relates to a transport apparatus for transporting an object to be transported such as a semiconductor wafer. More particularly, the present invention relates to a transport apparatus suitable for a semiconductor manufacturing system or the like that includes one or more processing chambers.

2. Description of the Related Art

A transport apparatus has been conventionally proposed, which brings a substrate into a processing chamber and carries it out from the processing chamber in a semiconductor manufacturing system (see the publication of Japanese Patent No. 3204115, for example). In the processing chamber, various processes can be performed.

The conventional transport apparatus has first, second, and third arms. Those arms respectively have three shafts that are coaxially arranged, and can be rotated independently of each other.

Each of the rotary shafts is linked to a reduction provided in an arm-rotating motor by means of a belt.

A base end of a first driven arm is rotatably linked to a top end of the first arm. A base end of a second driven arm is rotatably linked to a top end of the second arm. A first substrate holder is attached to top ends of the first and second driven arms.

Moreover, a base end of a third driven arm is rotatably linked to a top end of the third arm. A base end of a fourth driven arm is rotatably linked to the top end of the second arm in such a manner that the fourth driven arm can be coaxially rotated with respect to the second driven arm. A second substrate holder is attached to the top ends of the second and fourth driven arms.

In the above conventional transport apparatus, when the first and second substrate holders are located at the closest positions to the coaxial rotary shaft and face toward each other in a vertical direction (i.e., they are in a rotatable state), they are located on the same side of a straight line passing through the coaxial rotary shaft.

Thus, in the case where the transport apparatus performs a rotation while a large substrate is placed on the substrate holder, the distance from an end of the substrate to the center of rotation becomes larger and the rotation radius of the transport apparatus also becomes larger.

When the transport apparatus having such a large rotation radius is incorporated into a semiconductor manufacturing system, a central chamber for accommodating the transport apparatus therein becomes larger. Thus, an area required for installing the entire semiconductor manufacturing system becomes larger.

In addition, in the conventional transport apparatus having such a large rotation radius, a large centrifugal force is applied to the substrate on the substrate holder during the rotation. That centrifugal force may change the position of the substrate on the substrate holder when the rotation speed of the conventional transport apparatus increases. This may prevent the transport of the substrate.

Moreover, because the rotary shafts are linked to the reduction gear provided in the arm-rotating motor by means of belts in the conventional transport apparatus, a rotary force of the reduction gear is not properly transmitted to the respective rotary shafts in the case where tensions of the belts are changed by change in the surrounding temperature, change of the material with time, or the like. In some cases, hysteresis occurs in rotation of each rotary shaft due to normal rotation and reverse rotation of the arm-rotating motor. In those cases, the substrate placed on the substrate holder is not transported to a correct position.

Furthermore, the conventional transport apparatus has many components such as the rotary shafts, arm-rotating motor, and reduction gear. Thus, the fabrication cost of the conventional transport apparatus is high. The maintenance cost is also high because the components of the transport apparatus include many slidable parts.

In addition, it is necessary to use a motor that can generate a large torque as the arm-rotating motor because a transmitting force is consumed in the reduction gear. This makes the size of the transport apparatus larger and increases the fabrication cost of the transport apparatus.

Furthermore, the conventional transport apparatus detects an angle of rotation of a motor shaft of the arm-rotating motor by means of an angle detector and controls the angle of rotation. That is, an angle of rotation of each rotary shaft is not directly detected. Thus, it is not possible to detect whether or not each rotary shaft is rotated in an appropriate manner in accordance with a rotation instruction supplied to the arm-rotating motor. Therefore, the substrate placed on the substrate holder may not be transported to a correct position.

SUMMARY OF THE INVENTION

Thus, it is an object of the present invention to provide a transport apparatus which can prevent increase of a rotation radius when the transport apparatus is rotated while supporting a large object to be transported such as a large substrate, and which can prevent increase of an area required for installing a vacuum processing system such as a semiconductor manufacturing system when the transport apparatus is incorporated into the vacuum processing system.

Another object of the present invention is to provide a transport apparatus that can prevent a centrifugal force applied to an object to be transported from becoming larger when a rotation speed of the transport apparatus increases, and that can prevent change of a position of the object to be transported on a support unit.

Still another object of the present invention is to provide a transport apparatus which can properly transmit a rotary driving force of a rotating motor to a transport arm and correctly detect an angle of rotation of a rotary shaft, thereby transporting an object to be transported in a transport unit to a correct position, and which can reduce the number of components so as to reduce a maintenance cost and a fabrication cost of the transport apparatus.

In order to achieve the above objects, according to the present invention, a transport apparatus comprises: a first link mechanism including paired arms that are rotatable around a predetermined coaxial rotary shaft, the first link mechanism being provided with a first transport unit for transporting an object to be transported; a second link mechanism including paired arms that are rotatable around the coaxial rotary shaft, the second link mechanism sharing at least one of the paired arms with the first link mechanism, the second link mechanism being provided with a second transport unit for transporting an object to be transported; and a driving means for driving the arms, the first and second transport units are able to move beyond the coaxial rotary shaft without interfering with each other.

According to the present invention, in the transport apparatus, each of the first and second link mechanisms is formed by a parallel four-bar link mechanism that operates in a horizontal direction, and is provided with a dead point escape mechanism for allowing that link mechanism to pass through a dead point at which an angle formed by the paired arms of that link mechanism is 180 degrees.

The invention provides the transport apparatus that the driving means comprises first, second, and third driving shafts that are fixed to the arms of the first and second link mechanisms and are coaxially arranged; and a driving controller for controlling rotation of each of the first, second, and third driving shafts.

According to the present invention, the transport apparatus further comprises a vertical moving mechanism for moving the first and second link mechanisms in a vertical direction.

According to the present invention, in the transport apparatus, the driving means comprises: permanent magnets arranged at predetermined positions of the first, second, and third driving shafts, respectively; and electromagnetic stators provided to correspond to the respective permanent magnets, and the driving means is configured to supply driving currents to the electromagnetic stators based on predetermined information.

According to the present invention, in the transport apparatus, the driving means comprises angle sensors for detecting angles of rotation of the first, second, and third driving shafts, respectively, and the driving means is configured to control the rotation of each of the first, second, and third driving shafts based on the result obtained by the angle sensors.

According to the present invention, a method for controlling the transport apparatus of the present invention comprises the step of rotating the paired arms of each of the first and second link mechanisms around the coaxial rotary shaft in the same direction by the same angle, thereby rotating the first and second transport units around the coaxial rotary shaft.

According to the present invention, a method for controlling the transport apparatus as mentioned above further comprises the step of rotating the paired arms of one of the first and second link mechanisms around the coaxial rotary shaft in opposite directions to each other by the same angle and rotating the paired arms of the other link mechanism around the coaxial rotary shaft in the same direction by the same angle to move one of the first and second transport units toward a straight line passing through the coaxial rotary shaft.

According to the present invention, a method for controlling the aforementioned transport apparatus comprises the step of, when the first and second transport units are allowed to move to a rotatable region, rotating the paired arms of each of the first and second link mechanisms around the coaxial rotary shaft in opposite directions to each other by the same angle to move the first and second transport units toward the rotatable region, and, when one of the first and second transport units has reached the rotatable region, rotating the paired arms of the link mechanism including a reaching transport unit around the coaxial rotary shaft in the same direction by the same angle in order to turn the reaching transport unit around the coaxial rotary shaft, and rotating the paired arms of the other link mechanism including a non-reaching transport unit around the coaxial rotary shaft in opposite directions to each other by the same angle to further move the other transport unit toward the rotatable region.

According to the present invention, a vacuum processing system comprises: a transport chamber having the transport apparatus as mentioned above, and at least one vacuum processing chamber that is connected with the transport chamber and the vacuum processing chamber is configured to receive an object to be processed from the transport apparatus and hand it over to the transport apparatus.

In the present invention, the first and second transport units can move beyond the coaxial rotary shaft common to them without interfering with each other. Thus, each of objects to be transported in the first and second transport units can be moved to a position near a rotary shaft of rotation (retracted position).

In the case where the first and second transport units are located at the retracted positions, the first and second transport units can be arranged in such a manner that one of them is located above the other. Thus, when each of the first and second transport units supports a large object to be transported at the retracted position and is then rotated, a radius of the rotation can be reduced, as compared with the conventional technique. Therefore, the transport apparatus can be made compact.

According to the present invention, each object to be transported can be arranged near the rotary shaft of rotation. Thus, even when the rotation speed of the transport apparatus increases, a centrifugal force applied to the object to be transported does not become larger as compared with the conventional technique and the position of the object to be transported on the transport unit is not changed during the rotation of the transport apparatus.

In the present invention, in the case where each of the first and second link mechanism is formed by a parallel four-bar link mechanism operating in a horizontal direction and is provided with a dead point escape mechanism that can allow the link mechanism to pass through a dead point at which an angle formed by the paired arms of that link mechanism is 180 degrees, or in the case where the driving means includes: the first through third driving shafts that are fixed to the arms of the first and second link mechanisms and are arranged coaxially; and a driving controller for controlling rotation of each of the first through third driving shafts, paths of the first and second link mechanisms for driving the first and second transport units, respectively, can be made minimum. Therefore, the transport apparatus that requires a smaller installation area can be obtained.

In the present invention, in the case where the transport apparatus includes a vertical moving mechanism for moving the first and second link mechanisms in a vertical direction, the transport unit can be moved up and down without being affected by an operating time of a delivery mechanism for receiving and handing over an object to be transported such as a wafer in a processing chamber (e.g., hoist mechanism). Thus, it is possible to receive and hand over the object to be transported in the processing chamber in a short time. Therefore, a time required for exchanging the objects to be transported in the entire system can be shortened.

Moreover, due to the vertical moving mechanism, the first and second transport units that are arranged away from each other in the vertical direction can be brought into transport lines of objects to be transported during extended and retracted operations of the first and second link mechanisms. Thus, the height of the opening of the processing chamber can be made small and therefore the height of the processing chamber can be made small. This can make the transport apparatus compact.

In the present invention, in the case where the driving means includes: permanent magnets arranged at predetermined portions of the first to third driving shafts, respectively; and electromagnetic stators provided to correspond to the respective permanent magnets. The driving means is configured to supply driving currents to the electromagnetic stators based on predetermined information, a rotary force generated by magnetic actions of the electromagnetic stators and the permanent magnets is transmitted directly to the first and second link mechanisms through the first through third driving shafts accurately. Thus, hysteresis in rotation caused by normal rotation and reverse rotation of the motor does not occur. Therefore, the objects to be transported in the first and second transport units can be transported to correct positions, respectively.

Moreover, according to the present invention, the transport apparatus has a small number of components. Thus, the fabrication cost of the transport apparatus can be kept low. The maintenance cost thereof can be also kept low because there are a small number of sliding components. In addition, the transport apparatus of the present invention does not require a reduction gear and therefore consumption of a transmitting force can be prevented. Thus, a torque generated by the motor can be made small and accordingly the size of the motor can be made small. This can keep the fabrication cost of the transport apparatus low and can reduce the size of the transport apparatus.

In the present invention, in the case where an angle of rotation of each of the first through third driving shafts is detected by an angle sensor and the rotation of each of the first to third driving shafts is controlled based on the detection result, it is possible to directly confirm whether or not each rotary shaft is rotated appropriately in accordance with a rotation instruction supplied to the motor. Thus, the objects to be transported in the first and second transport units can be transported to correct positions, respectively.

In the present invention, the first and second transport units are rotated around the coaxial rotary shaft of the paired arms of the first and second link mechanisms by rotating the paired arms of each of the first and second link mechanisms around the coaxial rotary shaft in the same direction by the same angle.

Moreover, one of the first and second transport units is moved toward a straight line passing through the coaxial rotary shaft by rotating the paired arms of one of the first and second link mechanisms around the coaxial rotary shaft in opposite directions to each other by the same angle and rotating the paired arms of the other link mechanism around the coaxial rotary shaft in the same direction by the same angle.

By combining the above operations, one of the transport units can be made to extend or retract in one direction while the other transport unit is located at the retracted position, or the first and second link mechanisms can be rotated while both the first and second transport units are located at the retracted positions.

As described above, according to the present invention, an object to be transported placed in one transport unit can be moved to a destination, and thereafter that object can be replaced with another object to be transported placed at the destination by using the other transport unit. Thus, a time required for exchanging the objects to be transported can be shortened.

Moreover, in order to move the first and second transport units to the rotatable region, the following operation is performed in the present invention. First, the first and second transport units are moved toward the rotatable region by rotating the paired arms of each of the first and second link mechanisms around the coaxial rotary shaft in opposite directions to each other by the same angle. Then, when one of the first and second transport units has reached the rotatable region, the paired arms of one link mechanism including the reaching transport unit are rotated around the coaxial rotary shaft in the same direction by the same angle so as to turn the one transport unit around the coaxial rotary shaft, and the paired arms of the other link mechanism including the other non-reaching transport unit in the rotatable region are rotated around the coaxial rotary shaft in opposite directions to each other by the same angle so as to further move the other transport unit toward the rotatable region. By performing this operation, the first and second link mechanisms can be moved to their retracted positions without causing interference of movable parts of the first and second link mechanisms with a structure around the transport apparatus.

According to the vacuum processing system including the transport apparatus of the present invention, it is possible to bring an object to be processed into a processing chamber and bring it out of the processing chamber smoothly and rapidly. This largely contributes to improvement of the throughput of the vacuum processing system.

In addition, the transport apparatus of the present invention has a small rotation radius. Thus, a semiconductor manufacturing system for processing a semiconductor wafer, a liquid crystal display panel, or the like, can be made compact.

According to the present invention, the rotation radius of the transport apparatus does not become larger, even when the transport apparatus is rotated while supporting a large object to be transported such as a large substrate. Thus, if the transport apparatus is incorporated into a vacuum processing system such as a semiconductor manufacturing system, an area for installing the entire vacuum processing system can be made small.

Moreover, according to the present invention, a centrifugal force applied to the object to be transported does not become larger, even when a rotation speed of the transport apparatus increases. Thus, a position of the object to be transported does not change on the supporting unit.

According to the present invention, a rotary driving force of the rotating motor is accurately transmitted and an angle of rotation of the rotary shaft is correctly detected. Thus, the object to be transported in the transport unit can be transported to a correct position. Moreover, the number of components, the maintenance cost, and the fabrication cost of the transport apparatus can be reduced.

DETAILED DESCRIPTION OF THE PREFERRED EMBODIMENTS

Preferred embodiments of the present invention will now be described with reference to the drawings.

Figure 1:
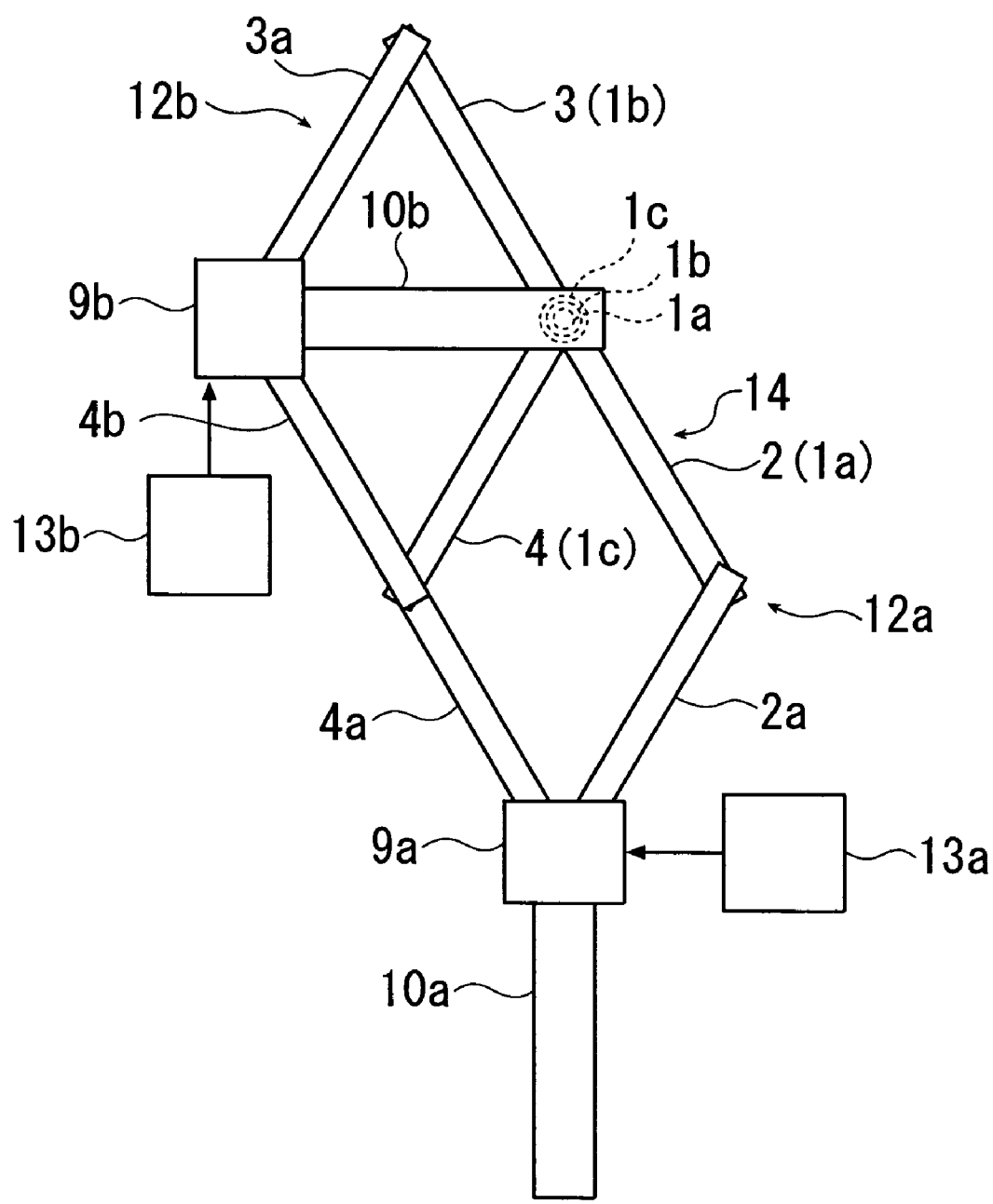
FIG. 1 is a plan view showing a basic structure of a transport apparatus according to a first embodiment of the present invention.
Figure 2:
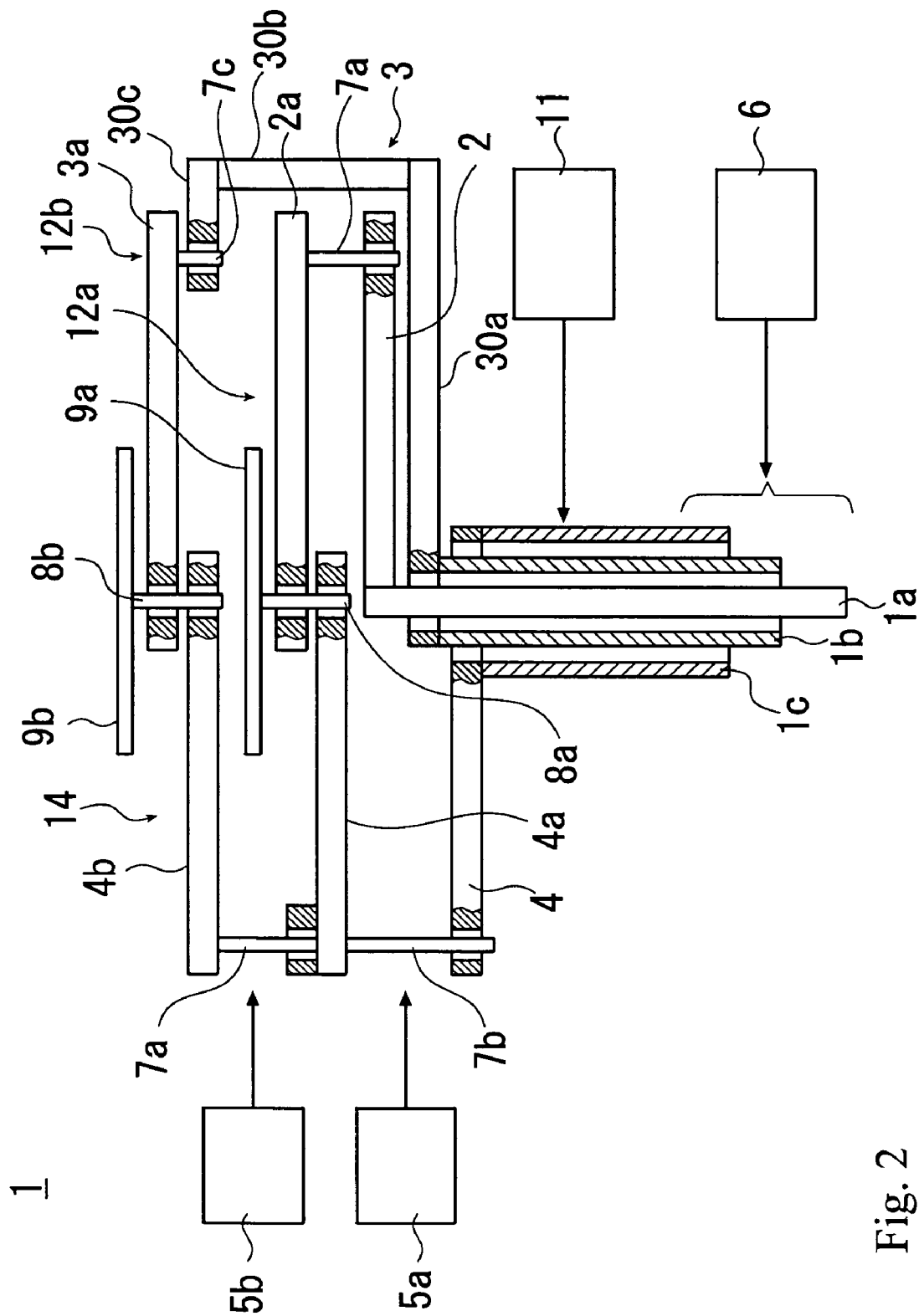
FIG. 2 is a vertical cross-sectional view showing the basic structure of the transport apparatus of the first embodiment.

FIGS. 1 and 2 are a plan view and a vertical cross-sectional view showing a basic configuration of a transport apparatus according to a first embodiment of the present invention.

As shown in FIGS. 1 and 2, the transport apparatus 1 of the present embodiment includes a first driving shaft 1a, a second driving shaft 1b, and a third driving shaft 1c. Those driving shafts 1a to 1c stand from the center in that order and can be coaxially rotated with respect to each other. A rotating power of driving means 6 described later is transmitted to each of the first through third driving shafts 1a to 1c, thereby rotation of each driving shaft can be controlled.

A first arm 2, a second arm 3, and a third arm 4 are fixed to upper ends of the first through third driving shafts 1a to 1c, respectively, to extend horizontally.

The first through third driving shafts 1a to 1c can be vertically moved by means of a vertical moving mechanism 11 described later.

In the present embodiment, a movable arm assembly 14 having the following configuration is provided.

In the movable arm assembly 14 of the present embodiment, a driven arm 2a is linked to a top end of the first arm 2 that extends straight so as to be rotatable in a horizontal plane. A driven arm 4a is linked to a top end of the third arm 4 that extends straight so as to be rotatable in a horizontal plane. Top ends of the driven arms 2a and 4a are linked to a support shaft 8a so as to be coaxially rotatable with respect to each other.

In this case, rotary shafts 7a and 7b provided at base ends of the driven arms 2a and 4a are attached to the first and third arms 2 and 4 via bearings (not shown), for example. Moreover, the top ends of the driven arms 2a and 4a are attached to the support shaft 8a via bearings (not shown), for example.

A holder 9a is fixed to the support shaft 8a. A known attitude control mechanism 13a is attached to the holder 9a so as to keep the holder 9a parallel to a direction of extension and retraction. The attitude control mechanism 13a is described in Japanese Patent Application Laid-Open No. 2002-200584, for example.

A first carrier (first transport unit) 10a on which an object to be transported such as a wafer can be placed is attached to the holder 9a.

In this manner, a first linkage (first link mechanism) 12a employing a parallel four-bar link mechanism is formed by the first arm 2, the third arm 4, the driven arm 2a, and the driven arm 4a in the present embodiment.

The first linkage 12a is provided with a first dead point escape mechanism 5a described later for allowing the holder 9a and the first carrier 10a to pass above the central rotary shaft of the first through third driving shafts 1a to 1c beyond a position at which an angle formed by the first arm 2 and the third arm 4 is 180 degrees (hereinafter, referred to as a dead point).

The second arm 3 is formed in an approximately U shape by a horizontal arm portion 30a, a vertical arm portion 30b, and a bent portion 30c. The horizontal arm portion 30a is longer than the first arm 2 and the driven arm 2a so as not to come into contact (interfere) with them. The vertical arm portion 30b extends vertically. A driven arm 3a is linked to the bent portion 30c of the second arm 3 above the driven arm 2a so as to be rotatable in a horizontal plane.

A driven arm 4b extending straight is linked on the base end of the driven arm 4a in such a manner that the driven arm 4b can be rotated without coming into contact with the first arm 2 and the holder 9a in a horizontal plane above them. Top ends of the driven arms 4b and 3a are linked to a support shaft 8b so as to be coaxially rotatable with respect to each other.

The driven arms 3a and 4b are attached by attaching rotary shafts 7c and 7d provided at their base ends to the second arm 3 and the driven arm 4a, respectively, via bearings (not shown), for example.

The center of the rotary shaft 7b of the driven arm 4a and the center of the rotary shaft 7d of the driven arm 4b are positioned to be coincident with each other.

The link of top ends of the driven arm 3a and the driven arm 4b to the support shaft 8b is achieved by using a bearing (not shown), for example.

A holder 9b is fixed to the support shaft 8b. A known attitude control mechanism 13b is attached to the holder 9b so as to keep the holder 9b parallel to a direction of extension and retraction. The attitude control mechanism 13b is described in Japanese Patent Laid-Open Publication No. 2002-200584 described above, for example.

A second carrier 10b on which an object to be transported such as a wafer can be placed is attached to the holder 9b.

In this manner, a second linkage (second link mechanism) 12b employing a parallel four-bar link mechanism, including the second carrier 10b located above the first carrier 10a, is formed by the second arm 3, the third arm 4, the driven arm 3a, and the driven arm 4b in the present embodiment.

The first and second linkages 12a and 12b share the third arm 4. However, they do not come into contact (interfere) with each other while the first and second carriers 10a and 10b are moved, because of the above structure.

The second linkage 12b is provided with a second dead point escape mechanism 5b described later for allowing the holder 9b and the second carrier 10b to pass above the central rotary shaft of the first through third driving shafts 1a to 1c beyond a position at which an angle formed by the second and third arms 3 and 4 is 180 degrees.

In the present embodiment, all of the arm lengths of the first arm 2, the second arm 3, the third arm 4, the driven arm 2a, the driven arm 3a, the driven arm 4a, and the driven arm 4b (i.e., the lengths between the rotary shafts) are the same.

Figure 3:
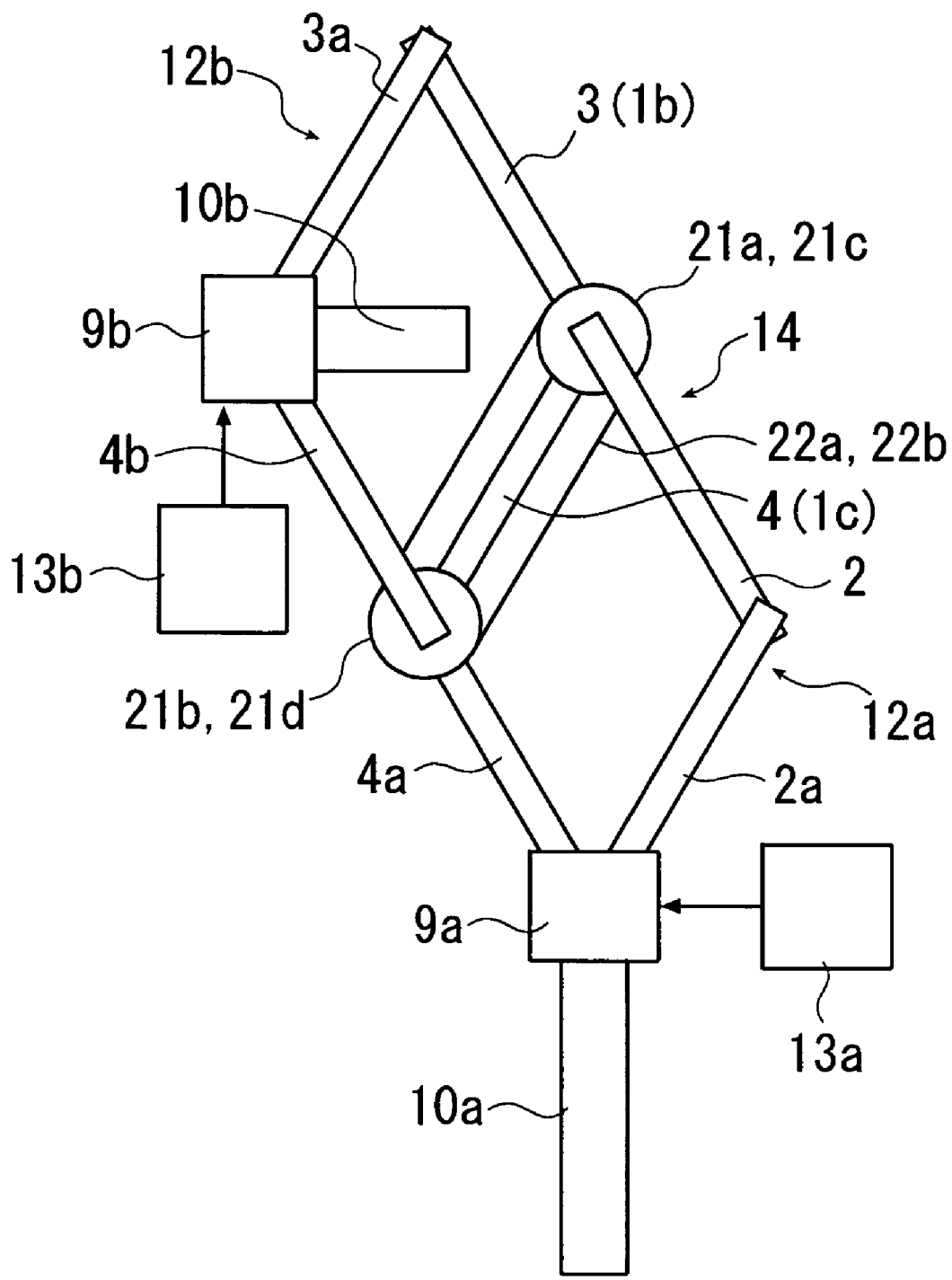
FIG. 3 is a plan view showing a specific structure of the transport apparatus of the first embodiment.
Figure 4:
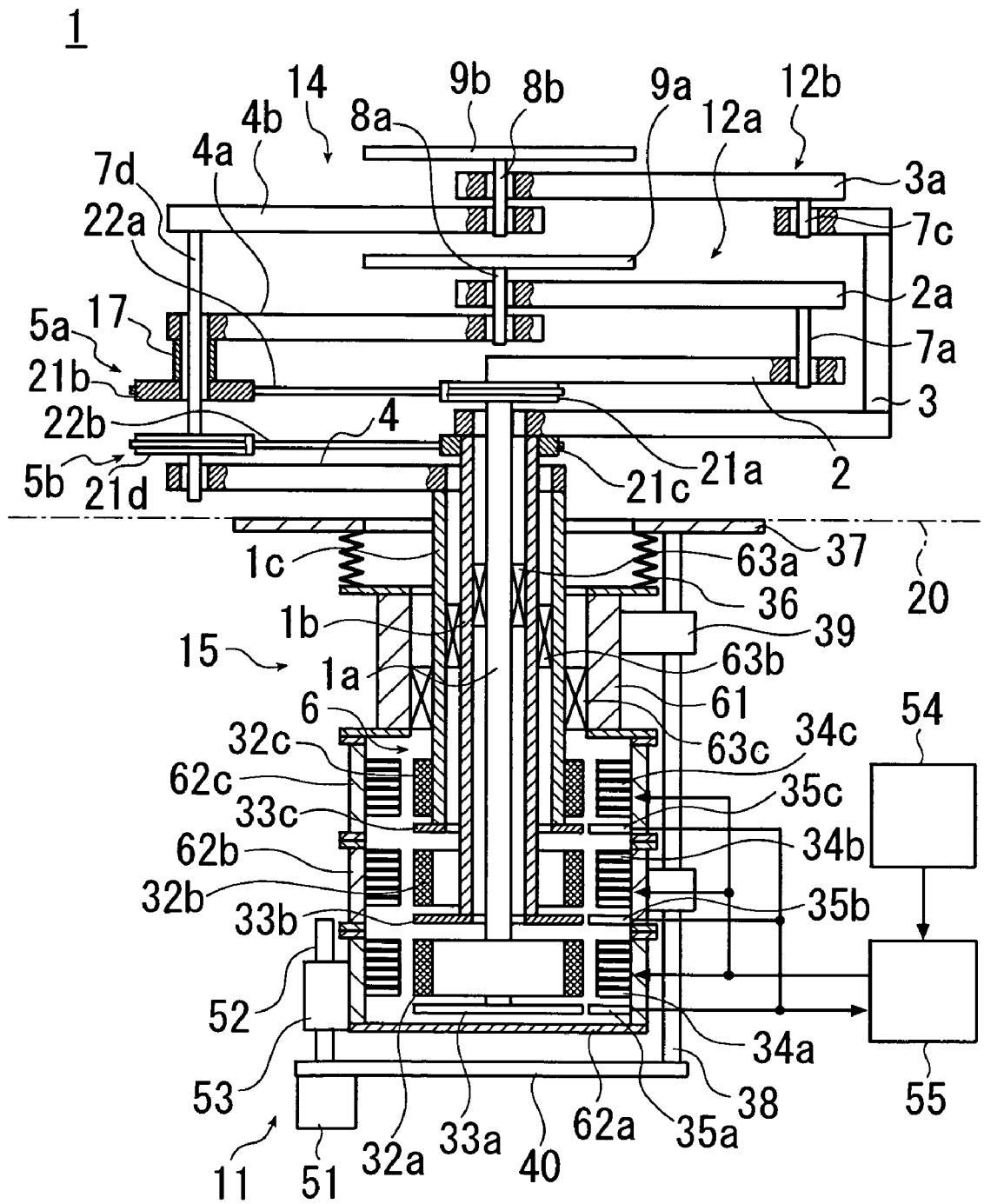
FIG. 4 is a vertical cross-sectional view showing the specific structure of the transport apparatus of the first embodiment.
Figure 5A:
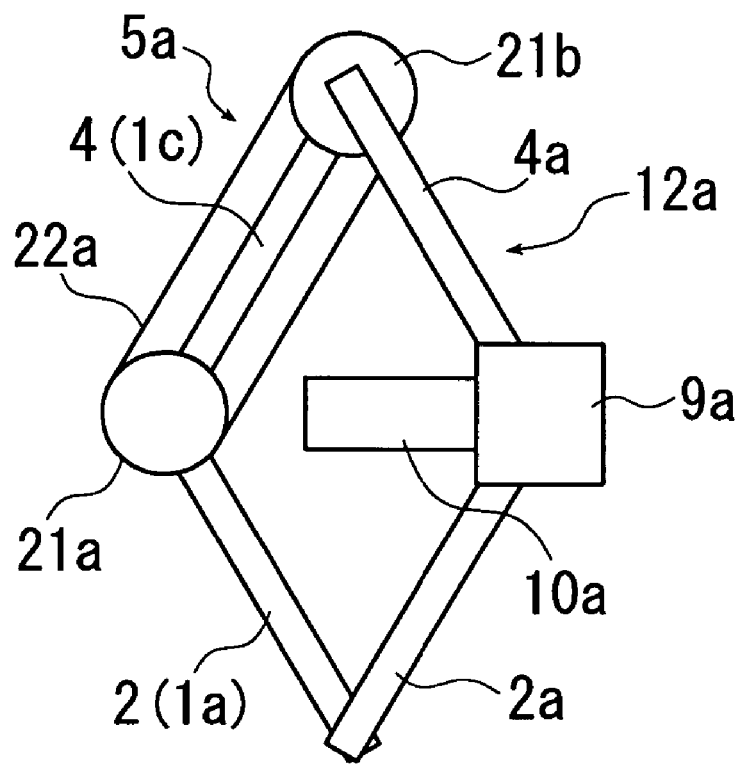
FIGS. 5A and 5B are diagrams explaining operations of dead point escape mechanisms of the transport apparatus of the first embodiment.
Figure 5B:
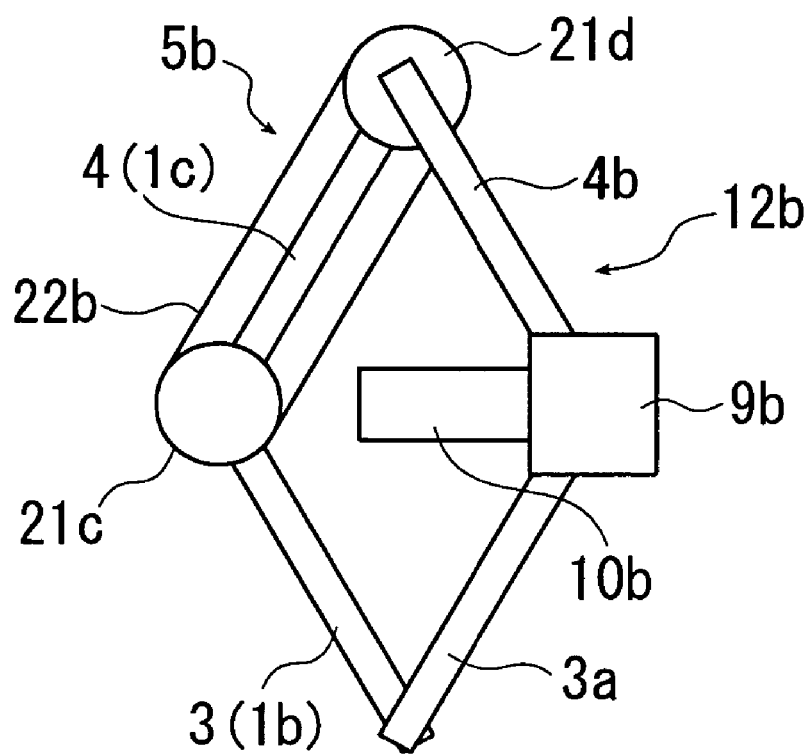

FIGS. 3 and 4 are a plan view and a vertical cross-sectional view showing a specific structure of the transport apparatus of the present embodiment, respectively, and FIGS. 5A and 5B are diagrams explaining operations of the dead point escape mechanisms of the transport apparatus of the present embodiment.

As shown in FIG. 4, the aforementioned movable arm assembly 14 is arranged on the bottom of a vacuum chamber 20 in the transport apparatus 1 of the present embodiment.

The first through third driving shafts 1a to 1c are accommodated in a main body 15 provided below the vacuum chamber 20.

The main body 15 includes an attachment flange 37 attached to a lower part of the vacuum chamber 20. One end of an extensible accordion bellows 36 is attached to a lower part of the attachment flange 37 in an airtight manner. A housing 61 is attached to the other end of the bellows 36 in an airtight manner. Casings 62a, 62b, and 62c are fixed to a lower part of the housing 61.

One or more supports 38 are attached to the attachment flange 37 to extend vertically and serve as guide rails such as a linear guide. The housing 61 and the casings 62a, 62b, and 62c can be moved up and down along the supports 38 by means of a slide mechanism 39 such as a linear bush.

A support substrate 40 is attached to a lower end of the support 38. A direct-acting motor 51 is provided at a predetermined position on the support substrate 40. A driving force generated by the motor 51 rotates a ball screw 52 of a ball screw nut 53 attached to the casing 62a, thereby moving the main body 15 up and down.

Shaft seal mechanisms 63a, 63b, and 63c are provided between the first and second driving shafts 1a and 1b, between the second and third driving shafts 1b and 1c, and between the third driving shaft 1c and the housing 61, respectively, in order to slidably link them in an airtight manner. The shaft seal mechanism is formed by magnetic fluid, such as an O-ring, or Wilson seal, for example.

Next, the driving means 6 for rotating and controlling the first through third driving shafts 1a to 1c and the vertical moving mechanism 11 for vertically moving the first and second linkages 12a and 12b are described.

The driving means 6 and the vertical moving mechanism 11 of the present embodiment have the following configuration.

As shown in FIG. 4, permanent magnets 32a, 32b, and 32c and sensor targets 33a, 33b, and 33c are attached to the lower ends of the first, second, and third driving shafts 1a, 1b, and 1c, respectively. Each of the sensor targets 33a, 33b, and 33c is used for detecting an angle of rotation of a corresponding one of the first through third driving shafts 1a to 1c.

Each of the permanent magnets 32a, 32b, and 32c is formed by a single magnetic part or a plurality of magnetic parts.

The sensor targets 33a, 33b, and 33c preferably have a disc-like shape or a cylindrical shape. A shape that causes change of magnetic fields in detectors 35a, 35b, and 35c described later, such as a concavo-convex shape, or a pattern that causes optical change in the detectors 35a, 35b, and 35c, such as a slit-like pattern is entirely formed on the circumferential surface of each sensor target.

Electromagnetic coils 34a, 34b, and 34c are attached to inner walls of the casings 62a, 62b, and 62c at optimum positions for magnetic couplings with the permanent magnets 32a, 32b, and 32c, respectively.

A predetermined current is supplied to each of the electromagnetic coils 34a, 34b, and 34c from a rotation control mechanism 55 in accordance with a rotation instruction from a control and instruction apparatus 54.

The detectors 35a, 35b, and 35c are also attached to the inner walls of the casings 62a, 62b, and 62c at optimum positions with respect to the sensor targets 33a, 33b, and 33c, respectively.

Information of angles of rotation of the first through third driving shafts 1a to 1c respectively detected by the detectors 35a, 35b, and 35c is fed back to the rotation control mechanism 55. In accordance with this information, the rotation control mechanism 55 controls rotation of the first through third driving shafts 1a to 1c accurately.

In the present embodiment having the aforementioned structure, when the rotation instruction is issued from the control and instruction apparatus 54 to the rotation control mechanism 55, as shown in FIG. 4, currents are supplied from the rotation control mechanism 55 to the electromagnetic coils 34a, 34b, and 34c. Thus, forces are applied to the permanent magnets 32a, 32b, and 32c that are magnetically coupled with the electromagnetic coils 34a, 34b, and 34c, respectively, thereby rotating the first through third driving shafts 1a to 1c.

The sensor targets 33a, 33b, and 33c are also rotated together with the rotation of the first through third driving shafts 1a to 1c. Thus, the pieces of information of rotational angles of the driving shafts 1a to 1c respectively detected by the detectors 35a, 35b, and 35c are fed back to the rotation control mechanism 55, thereby controlling the rotation of the first through third driving shafts 1a to 1c.

In case of vertically moving the first through third driving shafts 1a to 1c, the direct-acting motor 51 is operated. This causes expansion or folding of the bellows 36 so as to move the housing 61 and the casings 62a, 62b, and 62c along the supports 38 up or down.

The first through third driving shafts 1a to 1c are also moved up or down together with the housing 61. Therefore, the position in the vertical direction of the movable arm assembly 14 attached to the first through third driving shafts 1a to 1c is changed.

Next, the structure of the dead point escape mechanisms 5a and 5b as shown in FIG. 2 is described.

In the present embodiment, a first driving pulley 21a is fixed to the first driving shaft 1a, and a first driven pulley 21b is fixed to a lower end of a hollow rotary shaft 17 attached to the base end of the driven arm 4a, as shown in FIGS. 3 and 4, in such a manner that the central axis of first driven pulley 21b is made coincident with that of the hollow rotary shaft 17. The hollow rotary shaft 17 is configured to be rotatable around the rotary shaft 7d. A belt 22a is wound around the first driving pulley 21a and the first driven pulley 21b.

The first driving pulley 21a, the first driven pulley 21b, and the belt 22a form the first dead point escape mechanism 5a for allowing the holder 9a and the first carrier 10a to pass above the coaxial rotary shaft of the first through third driving shafts 1a to 1c beyond a position at which an angle formed by the first and third arms 2 and 4 is 180 degrees.

On the other hand, a second driving pulley 21c is fixed to the upper end of the second driving shaft 1b, and a second driven pulley 21d is fixed to the rotary shaft 7d of the driven arm 4b in such a manner that the central axis of the second driven pulley 21d is coincident with that of the rotary shaft 7d. A belt 22b is wound around the second driving pulley 21c and the second driven pulley 21d.

The second driving pulley 21c, the second driven pulley 21d, and the belt 22b form the second dead point escape mechanism 5b for allowing the holder 9b and the second carrier 10b to pass above the coaxial rotary shaft of the first through third driving shafts 1a to 1c beyond a position at which an angle formed by the second and third arms 3 and 4 is 180 degrees.

In the present embodiment, the diameter of the first driving pulley 21a and that of the first driven pulley 21b are the same in the first dead point escape mechanism 5a. Moreover, the diameter of the second driving pulley 21c and that of the second driven pulley 21d are the same in the second dead point escape mechanism 5b.

All the diameters of the first driving pulley 21a, the first driven pulley 21b, the second driving pulley 21c, and the second driven pulley 21d may be the same.

Operations of the dead point escape mechanisms of the present embodiment are now described with reference to FIGS. 5A and 5B.

Please note that the first linkage 12a and the second linkage 12b are shown separately in FIGS. 5A and 5B for convenience of explanation.

First, an operation of the first dead point escape mechanism 5a is described, referring to a case where the first linkage 12a located at a retracted position passes through the dead point and moves to an extended position.

When the first and third driving shafts 1a and 1c are rotated in opposite directions to each other by the same angle (the first driving shaft 1a (the first arm 2) is rotated in the CW (clockwise) direction and the third driving shaft 1c is rotated in the CCW (counterclockwise) direction in FIG. 5A), the first linkage 12a reaches the dead point at a time when an angle formed by the first arm 2 and the third arm 4 reaches 180 degrees.

In this state, when the first driving shaft 1a is rotated in the CW direction by a predetermined angle θ, the first driving pulley 21a that is attached to the first driving shaft 1a to be coaxially rotatable with respect to the first driving shaft 1a is also rotated in the CW direction by the angle θ.

At the same time, the third driving shaft 1c is rotated in the CCW direction by the angle θ. Thus, relative rotation of the first driving pulley 21a with respect to the third arm 4 is rotation in the CW direction by an angle 2θ, which is twice the angle of actual rotation of the first driving pulley 21a.

The rotation of the first driving pulley 21a is transmitted to the first driven pulley 21b through the belt 22a. Therefore, the first driven pulley 21b is also rotated in the CW direction by the angle 2θ with respect to the third arm 4.

As described above, when the first and third driving shafts 1a and 1c are rotated, the first driven pulley 21b is also rotated and the driven arm 4a is rotated with respect to the third arm 4. Thus, the first linkage 12a passes across the dead point, so that the first carrier 10a and the holder 9a move beyond the coaxial rotary shaft of the first, second, and third driving shafts 1a, 1b, and 1c.

In case of returning the first linkage 12a located at the extended position to the retracted position beyond the dead point, the aforementioned operation is performed in a reversed route.

Next, an operation of the second dead point escape mechanism 5b is described, referring to a case where the second linkage 12b located at the retracted position passes through the dead point and moves to the extended position, as an example.

When the second and third driving shafts 1b and 1c are rotated in opposite directions to each other by the same angle (the second driving shaft 1b (the second arm 3) is rotated in the CW direction and the third driving shaft 1c (the third arm 4) is rotated in the CCW direction in FIG. 5B), the second linkage 12b reaches the dead point at a time when an angle formed by the second and third arms 3 and 4 reaches 180 degrees.

In this state, when the second driving shaft 1b is rotated in the CW direction by a predetermined angle θ, the second driving pulley 21c that is attached to the second driving shaft 1b so as to be coaxially rotatable with respect to the second driving shaft 1b is also rotated in the CW direction by the angle θ.

At the same time, the third driving shaft 1c is rotated in the CCW direction by the angle θ. Therefore, relative rotation of the second driving pulley 21c with respect to the third arm 4 is rotation in the CW direction by an angle 2θ, which is twice the angle of actual rotation of the second driving pulley 21c.

The rotation of the second driving pulley 21c is transmitted to the second driven pulley 21d through the belt 22b. Thus, the second driven pulley 21d is also rotated in the CW direction by the angle 2θ with respect to the third arm 4.

As described above, when the second and third driving shafts 1b and 1c are rotated, the second driven pulley 21d is rotated and the driven arm 4b is rotated with respect to the third arm 4. Thus, the second linkage 12b passes from the dead point, so that the second carrier 10b and the holder 9b move beyond the coaxial rotary shaft of the first, second, and third driving shafts 1a, 1b, and 1c.

In case of returning the second linkage 12b located at the extended position to the retracted position beyond the dead point, the aforementioned operation is performed in a reversed route.

An operation of the transport apparatus 1 of the present embodiment is now described based on FIGS. 6A to 8C. In this description, a case where a processed wafer B placed in a processing chamber (not shown) of a semiconductor manufacturing system is replaced with an unprocessed wafer A is explained, as an example.

It is assumed that the unprocessed wafer A is placed on the second carrier 10b and no wafer is placed on the first carrier 10a.

Figure 6A:
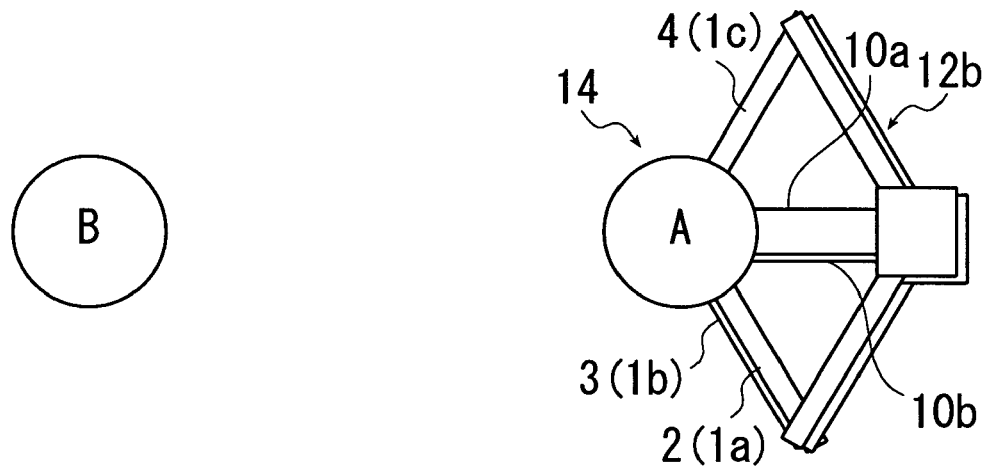
FIGS. 6A to 6C are diagram explaining an operation of the transport apparatus of the first embodiment.

First, the first and second linkages 12a and 12b are placed at their retracted positions, as shown in FIG. 6A. At this time, the first and second carriers 10a and 10b are opposed to each other in the vertical direction and the wafer A is located near the coaxial rotary shaft of the first through third driving shafts 1a to 1c.

In this state, when the first through third driving shafts 1a to 1c are rotated simultaneously in the same direction by the same angle, relative positions of the first through third arms 2 to 4 are not changed. Thus, the movable arm assembly 14 is rotated around the coaxial rotary shaft of the first through third driving shafts 1a to 1c while keeping a retracted state. As a result, two carriers 10a and 10b can be made to face the processed wafer B placed in the processing chamber (FIG. 6A).

Please note that the first linkage 12a and the second linkage 12b overlap each other under normal conditions when the movable arm assembly 14 is in the retracted state. However, for convenience of explanation, the first and second linkages 12a and 12b are shown as being misaligned slightly in the drawings.

Figure 6B:
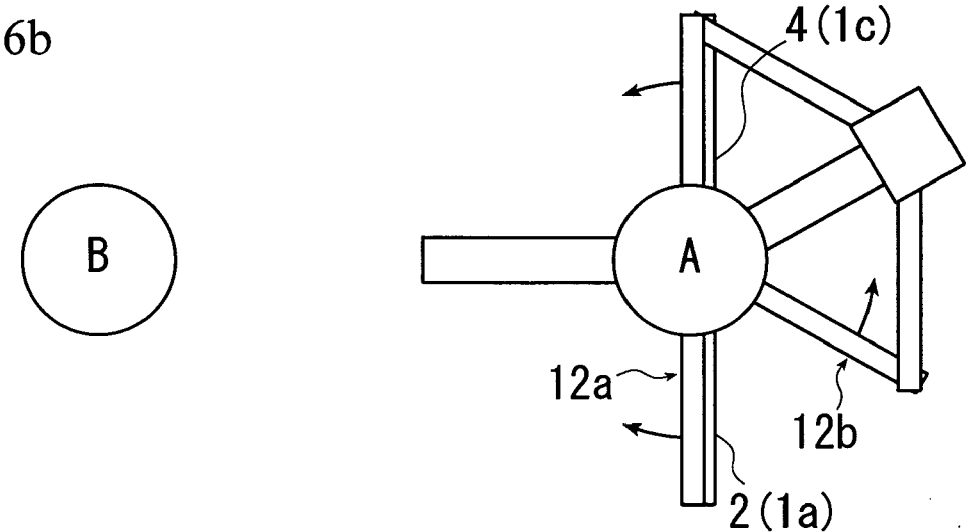

Then, when the first and third driving shafts 1a and 1c are rotated in opposite directions to each other by the same angle (the first driving shaft 1a (the first arm 2) is rotated in the CW direction and the third driving shaft 1c (the third arm 4) is rotated in the CCW direction in FIG. 6A), the first linkage 12a reaches the dead point (FIG. 6B). The first linkage 12a then passes across the dead point due to the action of the first dead point escape mechanism 5a. Thus, the first carrier 10a and the holder 9a move beyond the common coaxial rotary shaft of the first through third driving shafts 1a to 1c.

Figure 6C:
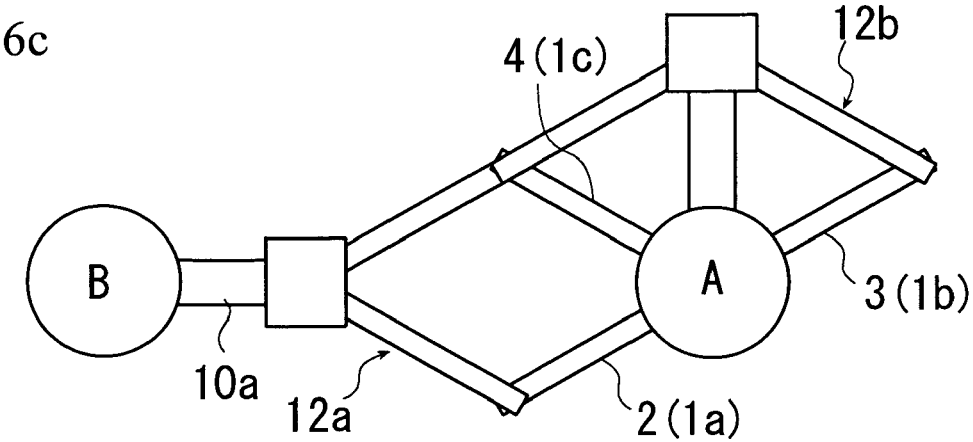

When the first and third driving shafts 1a and 1c are further rotated, the first carrier 10a reaches the extended position (FIG. 6C).

The first carrier 10a is located below the processed wafer B in this state. Thus, the vertical moving mechanism 11 is operated to move the first through third driving shafts 1a to 1c up in the vertical direction, thereby moving the entire movable arm assembly 14 including the first linkage 12a up. In this manner, the first carrier 10a receives the processed wafer B.

Figure 7A:
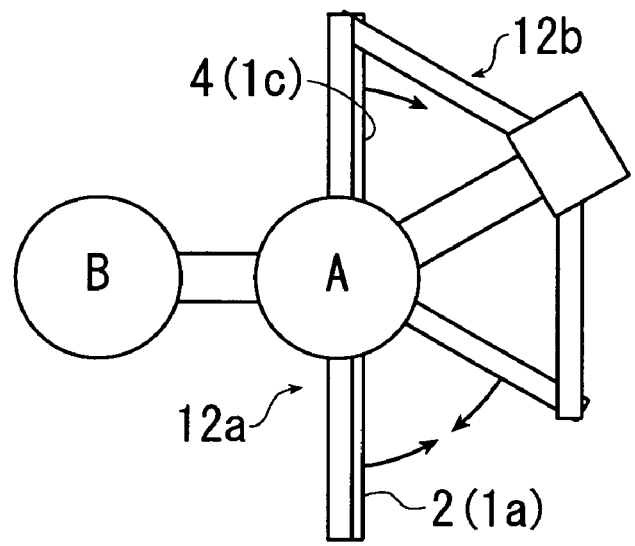
FIGS. 7A to 7C, are diagram explaining further operation of the transport apparatus of the first embodiment.

Next, in order to return the first carrier 10a located at the extended position to the retracted position, the first and third driving shafts 1a and 1c are rotated in opposite directions to each other by the same angle, contrary to the above operation (the first driving shaft 1a is rotated in the CCW direction and the third driving shaft 1c is rotated in the CW direction in FIG. 6C). Thus, the first linkage 12a reaches the dead point again (FIG. 7A). Then, the first linkage 12a passes across the dead point due to the action of the first dead point escape mechanism 5a, so that the first carrier 10a and the holder 9a move beyond the common coaxial rotary shaft of the first through third driving shafts 1a to 1c.

Figure 7B:
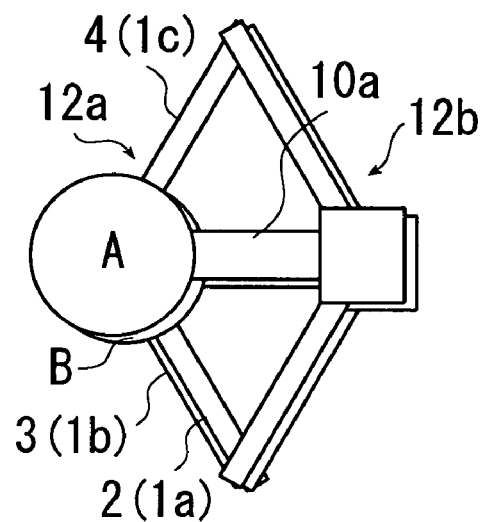

When the first and third driving shafts 1a and 1c are further rotated, the first carrier 10a is returned to the retracted position of the first linkage 12a (FIG. 7B).

In this state, the first and second carriers 10a and 10b face each other in the vertical direction. The wafer A and the wafer B also face each other in the vertical direction and are located near the coaxial rotary shaft of the first through third driving shafts 1a to 1c.

Moreover, when the second driving shaft 1b (the second arm 3) is rotated in the same direction by the same angle as the third driving shaft 1c at the same time with the above series of operations of the first and third driving shafts 1a and 1c, the second linkage 12b is rotated around the coaxial rotary shaft of the first through third driving shafts 1a to 1c while keeping the retracted state (FIGS. 6B to 7B). Thus, the wafer A on the second carrier 10b is not moved but is rotated near the coaxial rotary shaft of the first through third driving shafts 1a to 1c. Therefore, the wafer A cannot hit a structure around the transport apparatus.

Figure 7C:
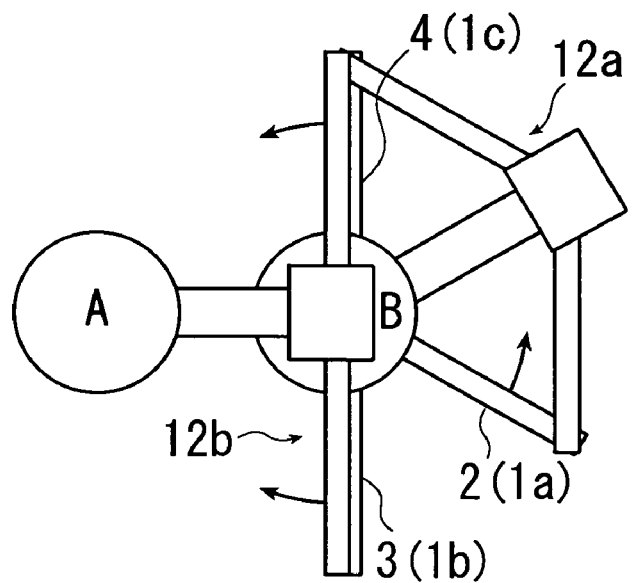
Figure 8:
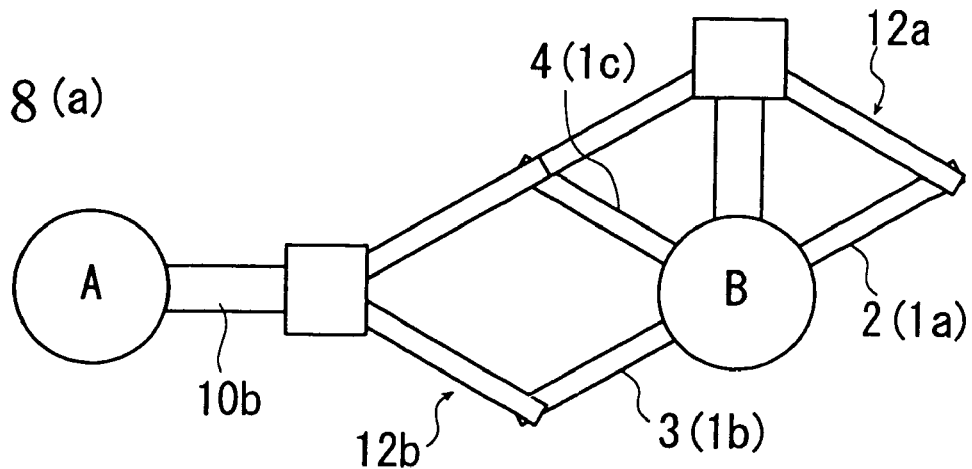
FIGS. 8A to 8C are diagram explaining still further operation of the transport apparatus of the first embodiment.
Figure 8:
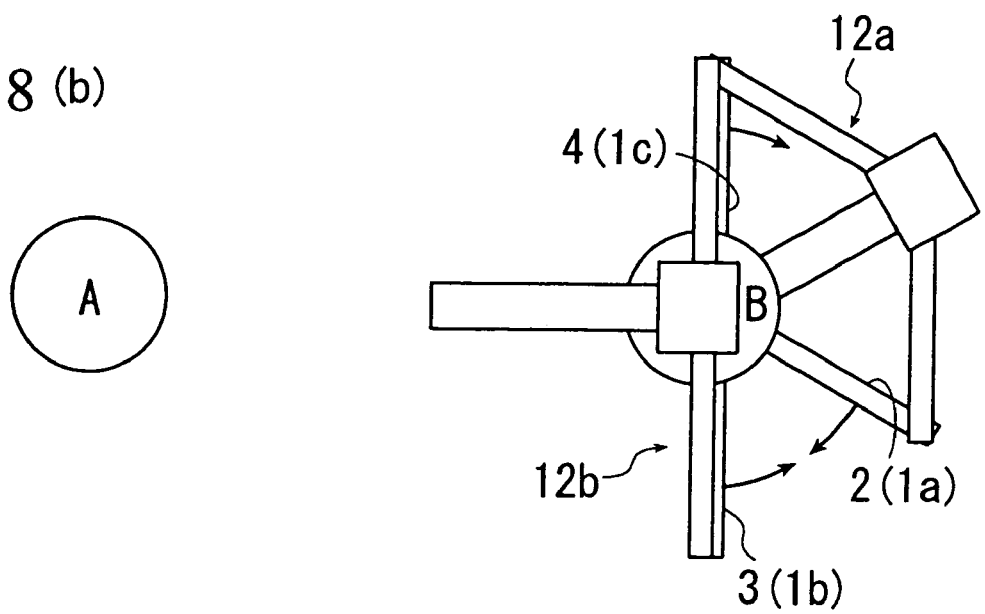
Figure 8:
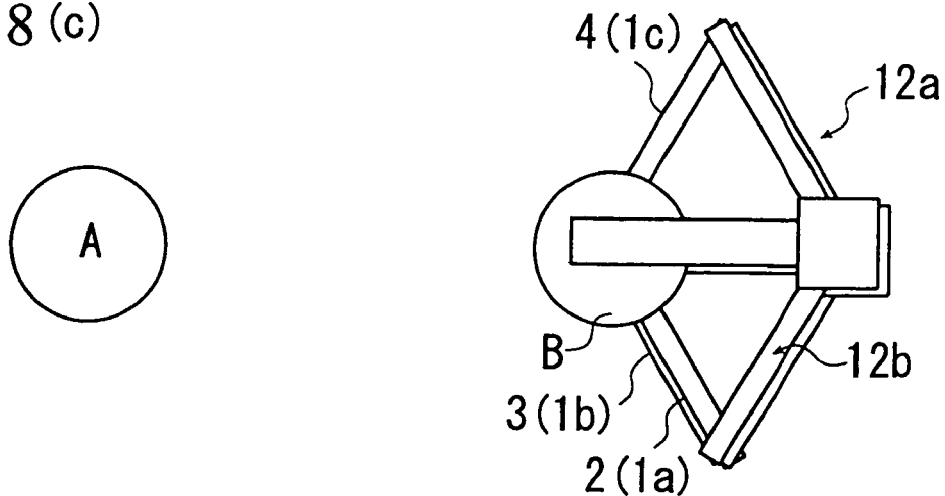

Next, when the second and third driving shafts 1b and 1c are rotated in opposite directions to each other by the same angle (the second driving shaft 1b (the second arm 3) is rotated in the CW direction and the third driving shaft 1c (the third arm 4) is rotated in the CCW direction in FIG. 7B), the second linkage 12b reaches the dead point (FIG. 7C). Then, the second linkage 12b passes across the dead point due to the action of the second dead point escape mechanism 5b, so that the second carrier 10b and the holder 9b move beyond the coaxial rotary shaft of the first through third driving shafts 1a to 1c.

When the second and third driving shafts 1b and 1c are further rotated, the second carrier 10b and the wafer A reach the extended position of the second linkage 12b (FIG. 8A).

In this state, the vertical moving mechanism 11 is operated to move the first through third driving shafts 1a to 1c down in the vertical direction, thereby handing over the unprocessed wafer A on the second carrier 10b to a processing apparatus (not shown).

Subsequently, in order to return the second carrier 10b located at the extended position to the retracted position, the second and third driving shafts 1b and 1c are rotated in opposite directions to each other by the same angle, contrary to the above (the second driving shaft 1b (the second arm 3) is rotated in the CCW direction and the third driving shaft 1c (the third arm 4) is rotated in the CW direction in FIG. 8A). Thus, the second linkage 12b reaches the dead point again (FIG. 8B). Then, the second linkage 12b passes across the dead point due to the action of the second dead point escape mechanism 5b, so that the second carrier 10b and the holder 9b move beyond the coaxial rotary shaft of the first through third driving shafts 1a to 1c.

When the second and third driving shafts 1b and 1c are further rotated, the second carrier 10b is returned to the retracted position (FIG. 8C).

In this state, the first and second carriers 10a and 10b face to each other in the vertical direction, and the wafer B is located near the coaxial rotary shaft of the first through third driving shafts 1a to 1c.

Moreover, when the first driving shaft 1a (the first arm 2) is rotated in the same direction by the same angle as the third driving shaft 1c in parallel with the aforementioned series of operations of the second and third driving shafts 1b and 1c, the first linkage 12a is rotated around the first through third driving shafts 1a to 1c while keeping the retracted state (FIGS. 7C to 8C). Thus, the wafer B on the first carrier 10a is not moved but is rotated near the coaxial rotary shaft of the first through third driving shafts 1a to 1c. That is, the wafer B cannot hit a structure around the transport apparatus.

In this manner, the processed wafer B in the processing chamber of the semiconductor manufacturing system can be efficiently replaced with the unprocessed wafer A in a short time.

Next, a method for moving the first and second linkages 12a and 12b into a rotatable region from a region outside the rotatable region is described with reference to FIGS. 9A to 9C, 10A, and 10B.

This operation is required in case of placing each of the first and second linkages 12a and 12b in the retracted state (e.g., the state shown in FIG. 6A) immediately after start-up of the transport apparatus 1, for example.

In FIGS. 9A to 9C and FIGS. 10A and 10B, a circle of dashed line represents a position of a vacuum chamber of a semiconductor manufacturing system, for example. The first linkage 12a and the second linkage 12b can be rotated within this circle.

Figure 9A:
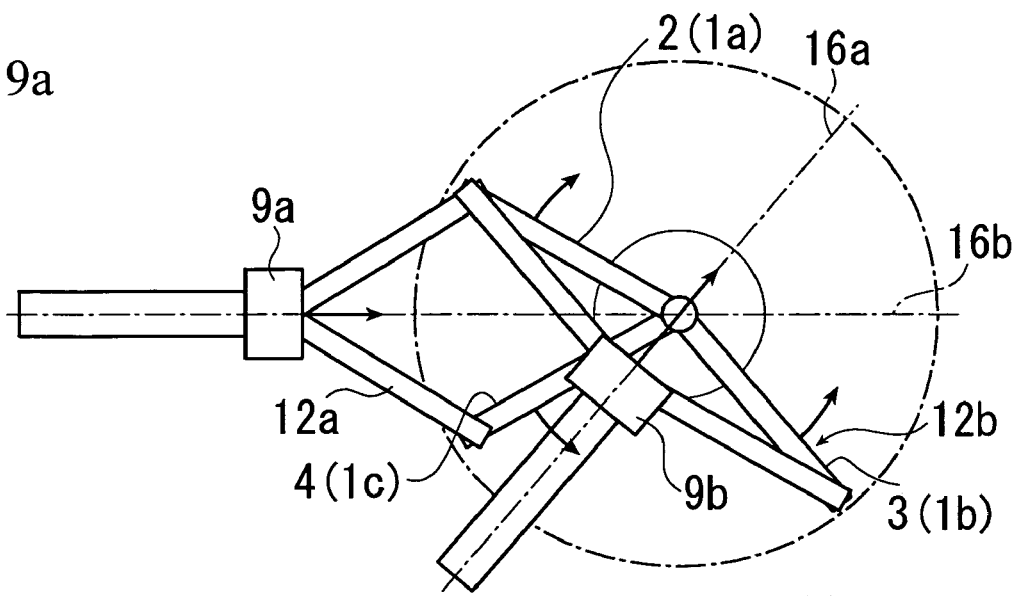
FIGS. 9A to 9C are diagrams showing how to move the first and second linkages into a rotatable region from a region outside the rotatable region in the transport apparatus of the first embodiment.
Figure 9B:
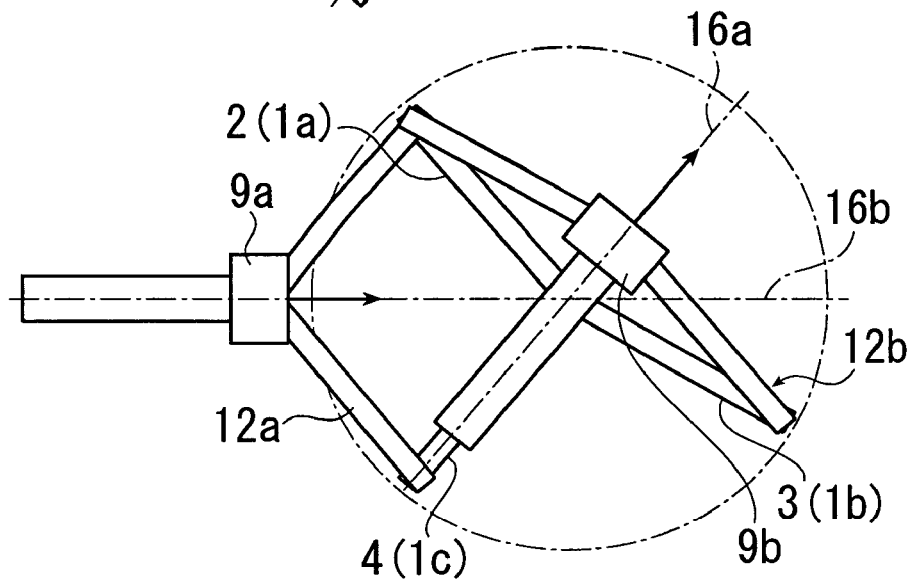

In this description, a case is considered where the first linkage 12a and the second linkage 12b are partially located outside the above rotatable region immediately after the start-up of the transport apparatus 1, as shown in FIG. 9A.

First, the first driving shaft 1a (the first arm 2) is rotated in the CW direction, the second driving shaft 1b (the second arm 3) is rotated in the CCW direction, and the third driving shaft 1c (the third arm 4) is rotated in the CCW direction, in FIG. 9A. In this case, angles of rotation of the driving shafts 1a, 1b, and 1c are the same.

Thus, the holder 9a and the first carrier 10a move back along a straight line 16a that is an axis of line symmetry with respect to the first linkage 12a. The holder 9b and the second carrier 10b move back along a straight line 16b that is an axis of line symmetry with respect to the second linkage 12b.

Figure 9C:
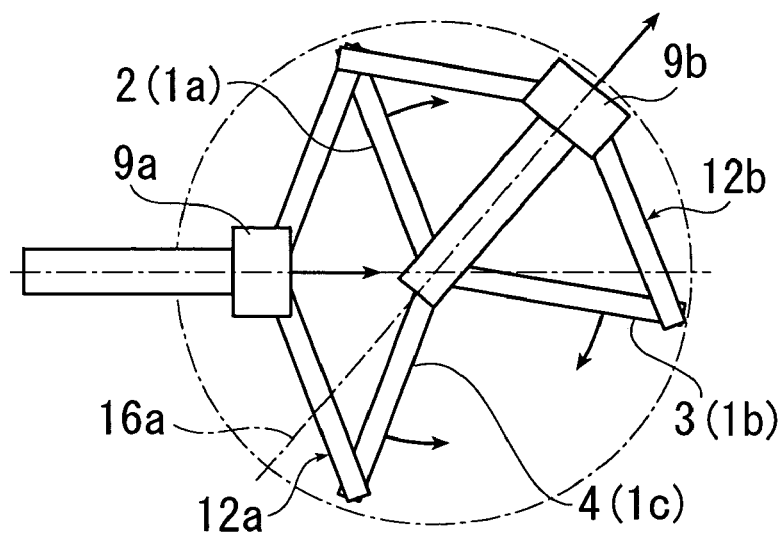

When the first through third driving shafts 1a to 1c are further rotated in the aforementioned directions, respectively, the second linkage 12b passes through the dead point due to the action of the second dead point escape mechanism 5b (FIG. 9B) and reaches the retracted position at which the second linkage 12b can be rotated (FIG. 9C).

At a time when the second linkage 12b has reached the retracted position at which it can be rotated, the direction of rotation of the second driving shaft 1b is changed from CCW direction to CW direction. That is, the first driving shaft 1a is rotated in the CW direction, the second driving shaft 1b is rotated in the CW direction, and the third driving shaft 1c is rotated in the CCW direction. The angles of rotation of those driving shafts 1a, 1b, and 1c are the same.

Figure 10A:
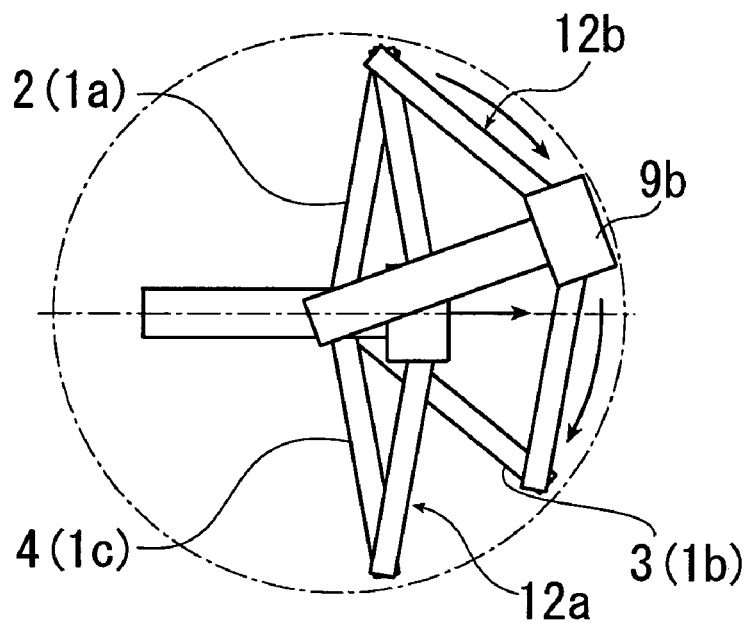
FIGS. 10A and 10b are diagrams showing further how to move the first and second linkages into a rotatable region from a region outside the rotatable region in the transport apparatus of the first embodiment.

Thus, the first linkage 12a passes through the dead point due to the effect of the first dead point escape mechanism 5a. Therefore, the support 9a and the first carrier 10a further move back along the straight line 16a. At the same time, the second linkage 12b is rotated around the coaxial rotary shaft of the first through third driving shafts 1a to 1c while keeping the retracted state, because the first driving shaft 1a and the second driving shaft 1b are rotated in same directions to each other by the same angle (FIG. 10A).

Figure 10B:
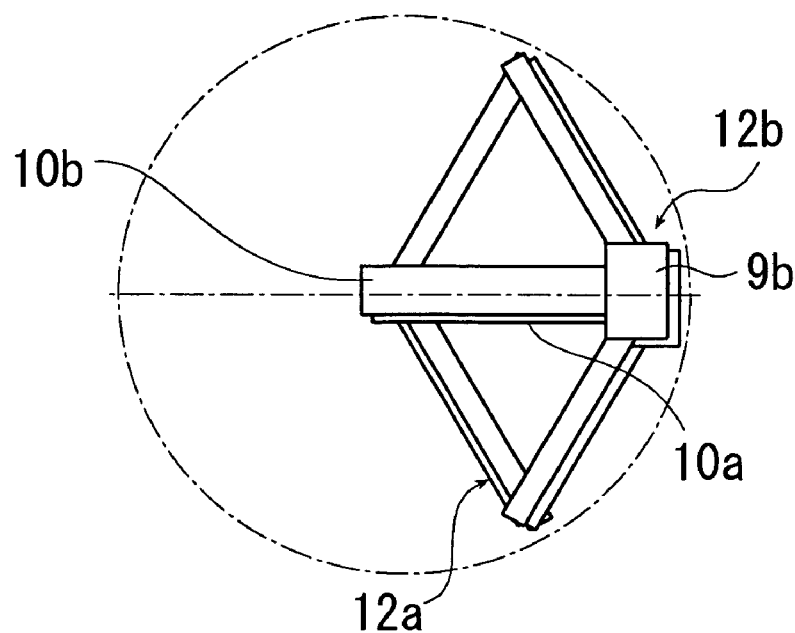

When the first through third driving shafts 1a to 1c are further rotated, the first linkage 12a reaches the retracted position (FIG. 10B). In this state, the first and second carriers 10a and 10b face each other in the vertical direction.

Each of the first linkage 12a and the second linkage 12b can be moved from the region outside the rotatable region into the rotatable region by performing the aforementioned operation.

In the case where the positional relationship between the first linkage 12a and the second linkage 12b is opposite to that shown in FIG. 9A, it is only necessary to rotate the first through third driving shafts 1a to 1c in a similar manner to the above operation.

According to the present embodiment, wafers or the like placed on the first and second carriers 10a and 10b can be moved to positions near the coaxial rotary shaft of the first through third driving shafts 1a to 1c, as described above. Therefore, the rotation radius of the transport apparatus can be made smaller than that in the conventional transport apparatus, even in the case where the transport apparatus is rotated while supporting a large wafer or the like at the retracted position. Thus, the transport apparatus can be made compact.

According to the present embodiment, even when the rotation speed of the transport apparatus 1 increases, a centrifugal force applied to a wafer or the like does not become larger, as compared with the conventional techniques. Thus, the position of the wafer on the first or second carrier 10a or 10b is not changed during rotation of the transport apparatus 1.

According to the present embodiment, a rotary force generated by magnetic actions of the electromagnetic coils 34a to 34c and the permanent magnets 32a to 32c is transmitted directly to the first and second linkages 12a and 12b through the first through third driving shafts 1a to 1c accurately. Thus, hysteresis in rotation is not caused by normal rotation and reverse rotation of the motor. Therefore, it is possible to transport a wafer or the like on each of the first and second carriers 10a and 10b to a correct position.

In the present embodiment, the pieces of information of rotational angles of the first through third driving shafts 1a to 1c respectively detected by the detectors 35a, 35b, and 35c are fed back so as to control rotation of the first through third driving shafts 1a to 1c. Thus, it is possible to transport a wafer or the like on each of the first and second carriers 10a and 10b to a correct position.

According to the present embodiment, the transport apparatus has a small number of components and therefore the fabrication cost thereof can be kept low. The maintenance cost thereof can also be kept low because there are few sliding parts. In addition, the reduction gear apparatus of the present invention does not need a reduction gear or the like and a transmitting force is not consumed. Thus, a torque generated by the motor can be made small. This can reduce the size of the motor and hence the fabrication cost. The size of the transport apparatus 1 can be also reduced.

Figure 11:
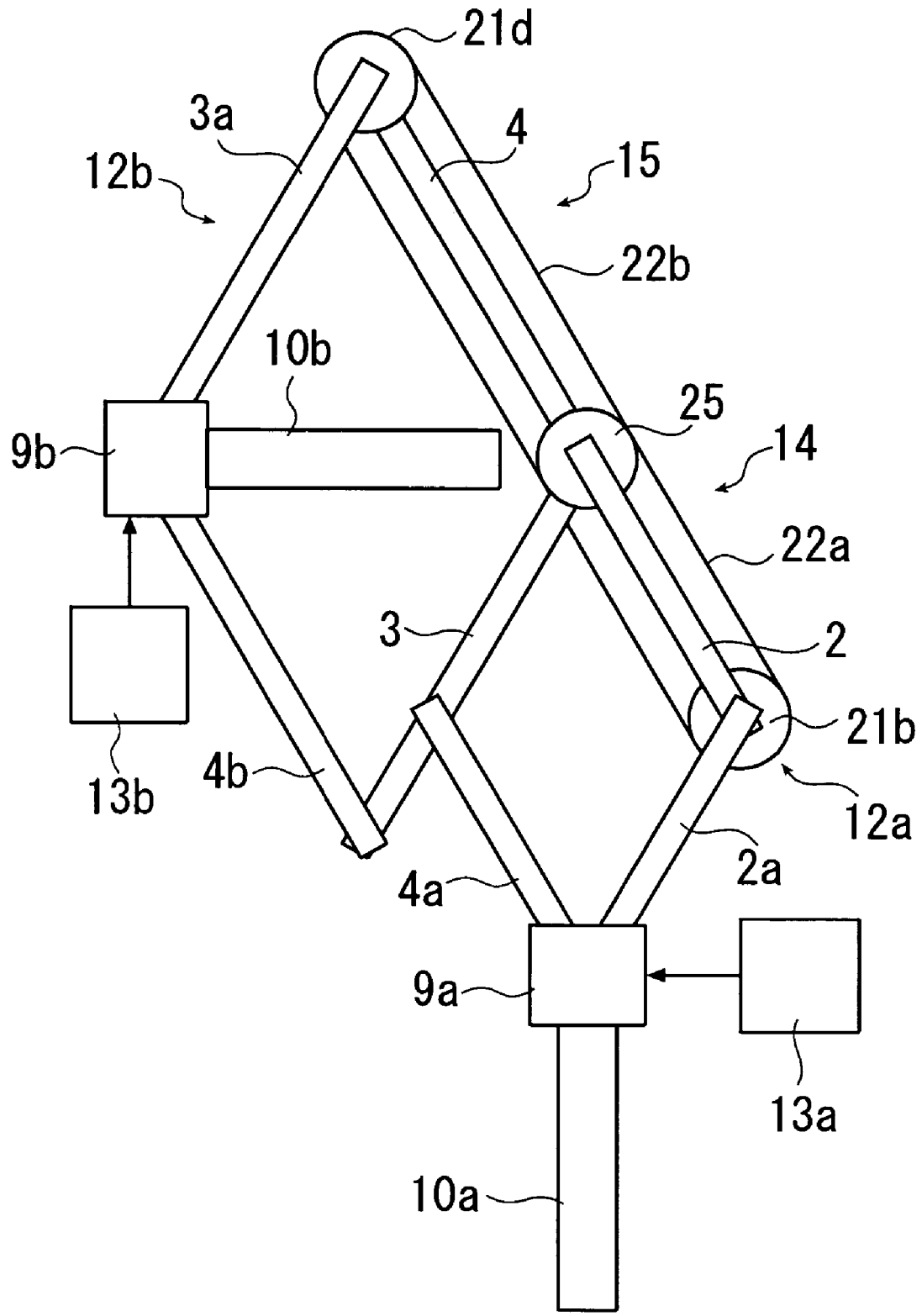
FIG. 11 is a plan view showing a structure of a transport apparatus according to a second embodiment of the present invention.
Figure 12:
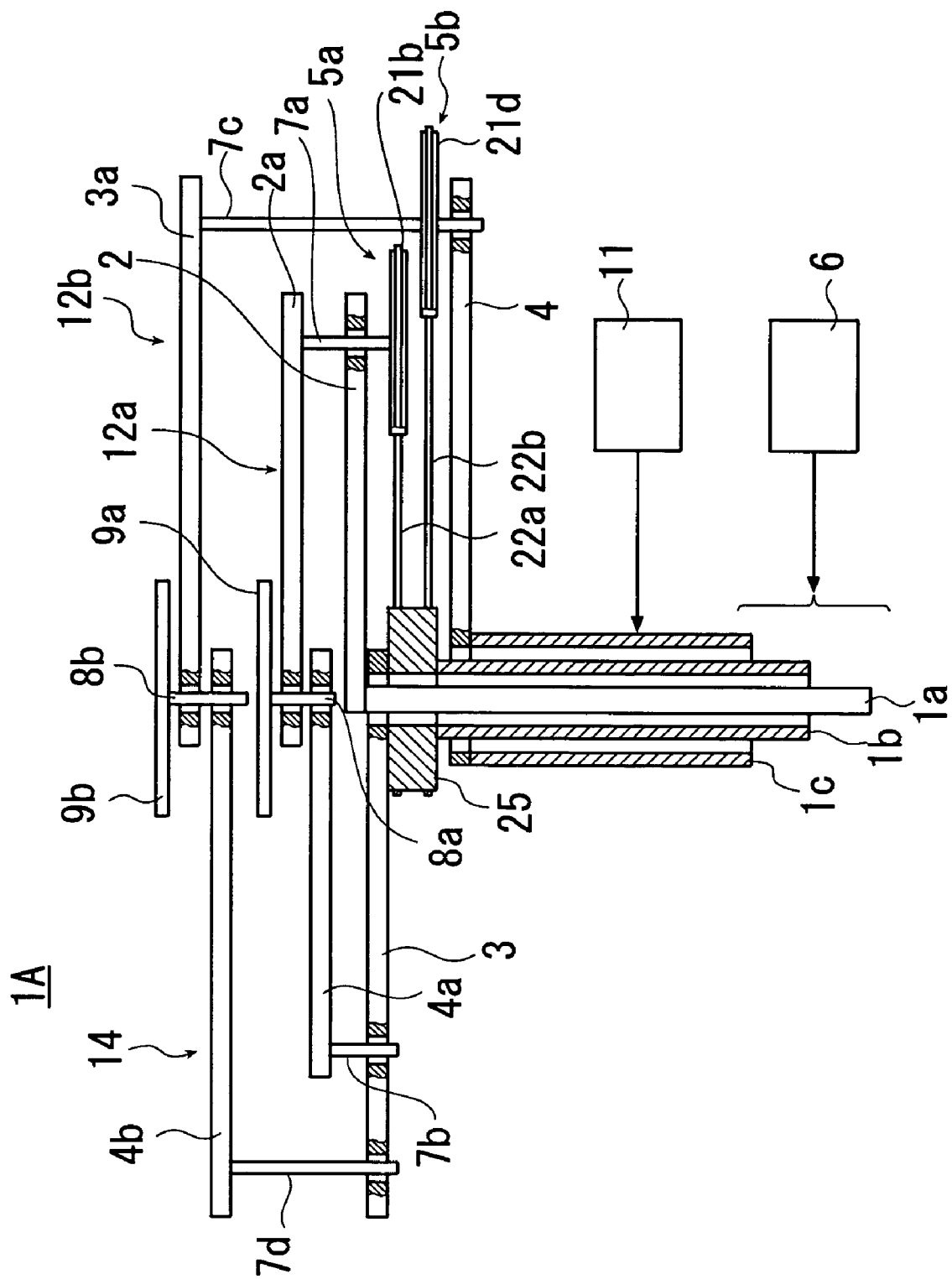
FIG. 12 is a vertical cross-sectional view showing the structure of the transport apparatus of the second embodiment.
Figure 13A:
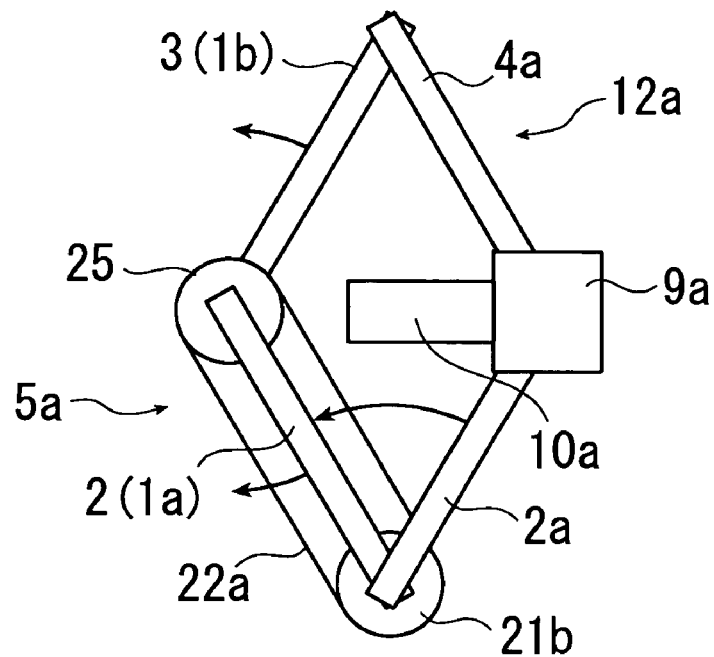
FIGS. 13A and 13B are diagrams explaining operations of dead point escape mechanisms of the transport apparatus of the second embodiment.
Figure 13B:
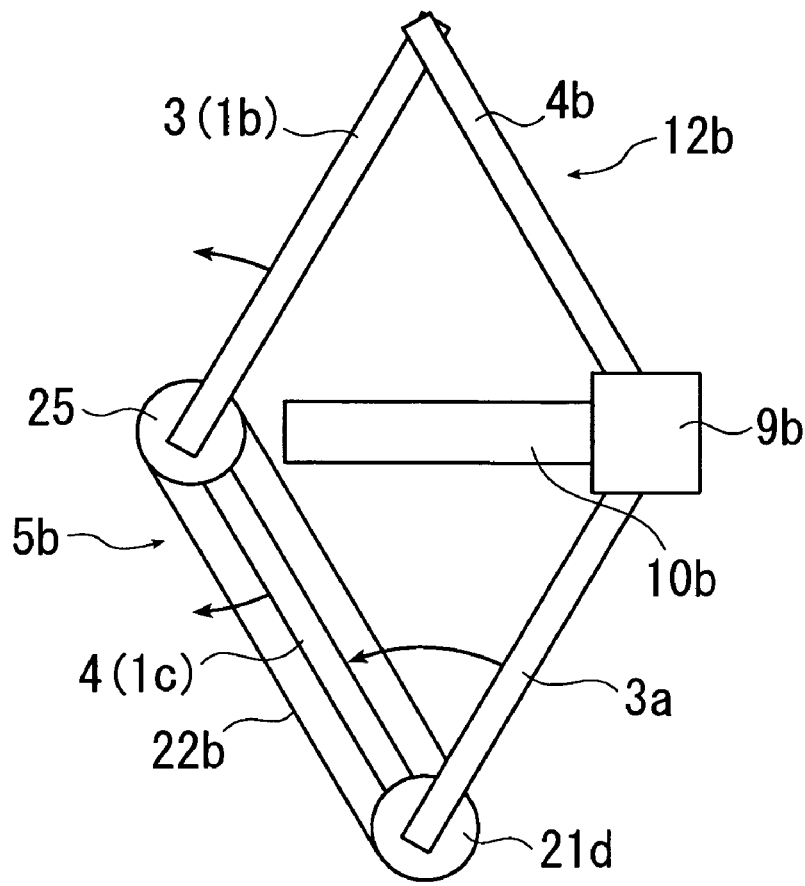

FIGS. 11 and 12 are a plan view and a vertical cross-sectional view showing a structure of a transport apparatus according to the second embodiment of the present invention, respectively. FIGS. 13A and 13B are diagrams explaining operations of dead point escape mechanisms of the transport apparatus of the second embodiment. The components corresponding to those in the first embodiment are labeled with the same reference numerals as those in the first embodiment, and the detailed description thereof is omitted.

The transport apparatus 1A of the present embodiment includes the first linkage 12a and the second linkage 12b in such a manner that the arm length of the first linkage 12a is longer than that of the second linkage 12b, as shown in FIG. 11.

In the present embodiment, the second and third arms 3 and 4 are longer than the first arm 2. Moreover, the driven arms 4b and 3a respectively corresponding to the second and third arms 3 and 4 are longer than the driven arms 2a and 4a.

The driven arm 4a is linked to a middle part of the second arm 3 that is driven by the second driving shaft 1b, so as to be rotatable in a horizontal plane around the rotary shaft 7b provided at the base end of the driven arm 4a. The driven arm 2a and the driven arm 4a are linked at their top ends to the support shaft 8a of the holder 9a so as to be coaxially rotatable with respect to each other, as in the first embodiment. In this manner, the first linkage 12a is formed.

The second linkage 12b has the same basic structure as that in the first embodiment.

More specifically, the driven arm 4b is linked to the top end of the second arm 3a so as to be rotatable in a horizontal plane around the rotary shaft 7d provided at the base end of the driven arm 4b. The driven arm 3a is linked to the top end of the third arm 4 so as to be rotatable around the rotary shaft 7c provided at the base end of the driven arm 3 in a horizontal plane. The top ends of the driven arms 4b and 3a are linked to the support shaft 8b of the holder 9b so as to be coaxially rotatable with respect to each other.

In this case, in order to prevent contact (interference) of the second linkage 12b with the first linkage 12a, the lengths of the second arm 3 and the third arm 4 are adjusted. In addition, the lengths of the rotary shafts 7c and 7d are made longer so as to arrange the driven arms 3a and 4b above the holder 9a.

The aforementioned second carrier 10b is attached to the holder 9b. In this manner, the second linkage 12b is formed to include the second carrier 10b located above the first carrier 10a without causing interference of the second carrier 10b with the first carrier 10a.

Moreover, in the present embodiment, a driving pulley 25 is fixed to the second driving shaft 1b, and the first driven pulley 21b is fixed central axis coincidently with the rotary shaft 7a of the driven arm 2a. A belt 22a is wound around the driving pulley 25 and the first driven pulley 21b.

The driving pulley 25, the first driven pulley 21b, and the belt 22a form the first dead point escape mechanism 5a having a similar structure to that in the first embodiment.

In addition, the second driven pulley 21d is fixed to the rotary shaft 7c of the driven arm 3a with its central axis coincident with the rotary shaft 7c. A belt 22b is wound around the second driven pulley 21d and the aforementioned driving pulley 25. The driving pulley 25, the second driven pulley 21d, and the belt 22b form the second dead point escape mechanism 5b having a similar structure to that in the first embodiment.

An operation of the first dead point escape mechanism 5a is now described, referring to a case where the first linkage 12a located at its retracted position passes through the dead point and moves to its extended position, as an example.

When the first and second driving shafts 1a and 1b are rotated in opposite directions to each other by the same angle (the first driving shaft 1a (the first arm 2) is rotated in the CW direction and the second driving shaft 1b (the second arm 3) is rotated in the CCW direction in FIG. 13A), the first linkage 12a reaches the dead point at a time when an angle formed by the first arm 2 and the second arm 3 reaches 180 degrees.

In this state, when the second driving shaft 1b is further rotated in the CCW direction by an angle θ, the driving pulley 25, that is attached to the second driving shaft 1b to be coaxially rotatable with respect to the second driving shaft 1b, is also rotated in the CCW direction by the angle θ.

In parallel with the above, the first driving shaft 1a is rotated in the CW direction by the angle θ. Thus, relative rotation of the driving pulley 25 with respect to the first arm 2 is rotation in the CCW direction by an angle 2θ, which is twice the angle of actual rotation.

The rotation of the driving pulley 25 is transmitted to the first driven pulley 21b through the belt 22a. Thus, the first driven pulley 21b is also rotated with respect to the first arm 2 in the CCW direction by the angle 2θ.As described above, when the first and second driving shafts 1a and 1b are rotated, the first driven pulley 21b is rotated, and the driven arm 2a is rotated with respect the first arm 2. Thus, the first linkage 12a passes across the dead point, so that the first carrier 10a and the holder 9a move beyond the common coaxial rotary shaft of the first through third driving shafts 1a to 1c.

In case of returning the first linkage 12a located at its extended position to its retracted position beyond the dead point, the operation described above is performed in a reversed route.

Next, an operation of the second dead point escape mechanism 5b is described, referring to a case where the second linkage 12b located at the retracted position passes through the dead point and moves to the extended position, as an example.

When the second and third driving shafts 1b and 1c are rotated in opposite directions to each other by the same angle (the third driving shaft 1c (the third arm 4) is rotated in the CW direction and the second driving shaft 1b (the second arm 3) is rotated in the CCW direction in FIG. 13B), the second linkage 12b reaches the dead point at a time when an angle formed by the second arm 3 and the third arm 4 reaches 180 degrees.

In this state, when the second driving shaft 1b is further rotated in the CCW direction by an angle θ, the driving pulley 25, that is attached to the second driving shaft 1b to be coaxially rotatable with respect to the second driving shaft 1b, is also rotated in the CCW direction by the angle θ.

In parallel with the above, the third driving shaft 1c is rotated in the CW direction by the angle θ. Thus, relative rotation of the driving pulley 25 with respect to the third arm 4 is rotation in the CCW direction by an angle 2θ, which is twice the angle of actual rotation.

The rotation of the driving pulley 25 is transmitted to the second driven pulley 21d through the belt 22b. Thus, the second driven pulley 21d is also rotated with respect to the third arm 4 in the CCW direction by the angle 2θ. As described above, when the second and third driving shafts 1b and 1c are rotated, the second driven pulley 21d is rotated, and the driven arm 3a is rotated with respect the third arm 4. Thus, the second linkage 12b passes across the dead point, so that the second carrier 10b and the holder 9b move beyond the common coaxial rotary shaft of the first through third driving shafts 1a to 1c.

In case of returning the second linkage 12b located at the extended position to the retracted position beyond the dead point, the operation described above is performed in a reversed route.

According to the present embodiment having the aforementioned configuration, the following effect can be achieved in addition to the same effects as those obtained in the first embodiment. Since the rotary shaft 7c to which the first driven pulley 21b is attached and the rotary shaft 7a to which the second driven pulley 21d is attached are independent of each other unlike those of the first embodiment, the assembly can be easily done and a time required for the assembly can be shortened. Except for the structure, operation and effects described above, the present embodiment is the same as the first embodiment. Thus, the further description of the present embodiment is omitted.

Figure 14:
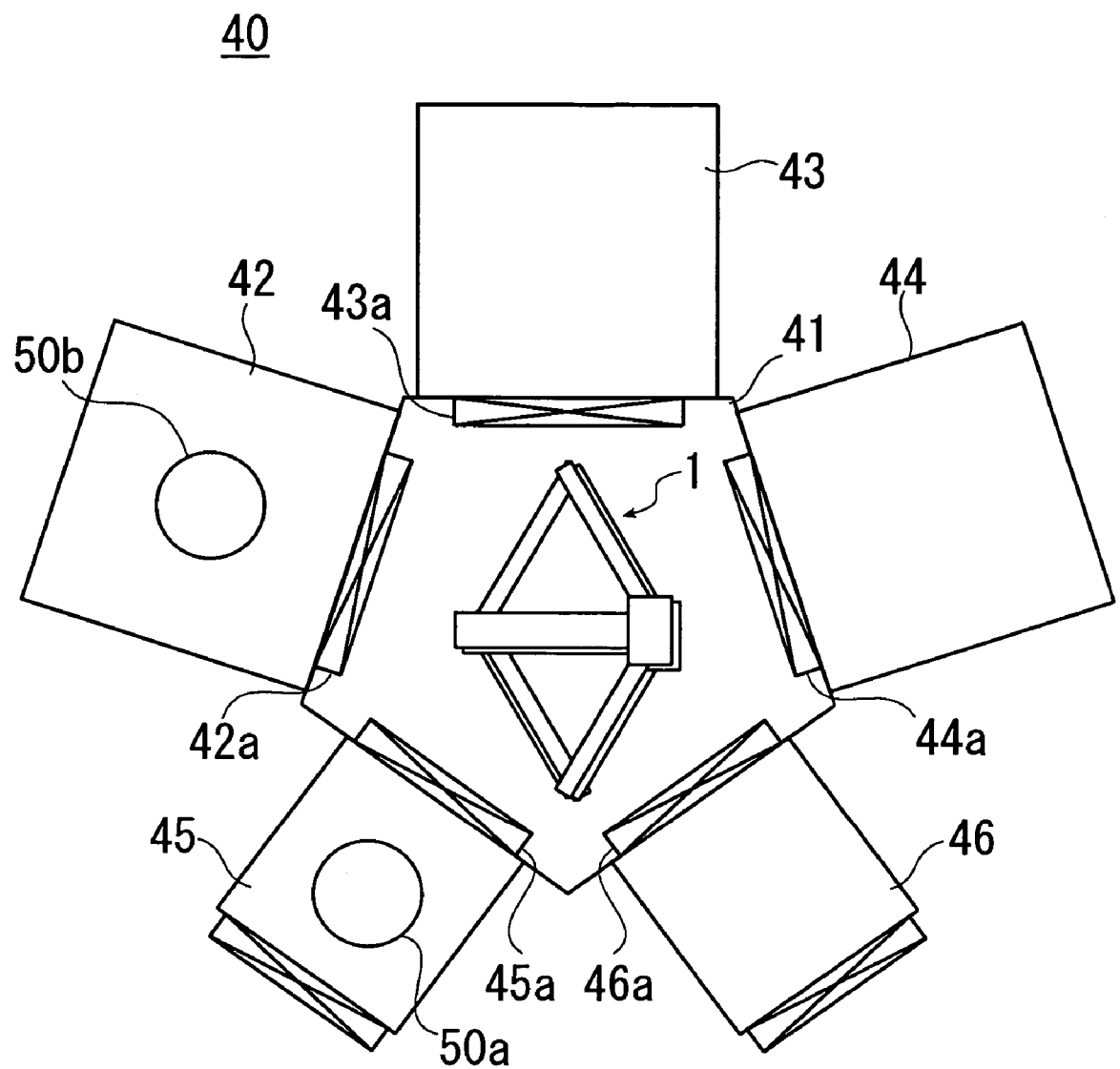
FIG. 14 is a plan view of an exemplary vacuum processing system including the transport apparatus of the present invention.

FIG. 14 is a plan view of an exemplary vacuum processing system including the transport apparatus according to the present invention.

A semiconductor manufacturing system 40 as an example of the vacuum processing system of the present invention includes a transport chamber 41 in which the aforementioned transport apparatus 1 is provided, and three processing chambers 42, 43, and 44 in which three processes can be performed in parallel; a loading chamber 45 for carrying a wafer in the semiconductor manufacturing system 40; and an unloading chamber 46 for carrying a wafer out of the semiconductor manufacturing system 40 are arranged around the transport chamber 41, as shown in FIG. 14.

The processing chambers 42 to 44, the loading chamber 45, and the unloading chamber 46 are connected to an evacuation system (not shown). Isolation valves 42a to 46a are provided between the transport chamber 41 and the processing chambers 42 to 44, the loading chamber 45, and the unloading chamber 46, respectively.

The transport apparatus 1 brings out an unprocessed wafer 50a placed in the loading chamber 45, and holds and transports it to the processing chamber 42, for example.

At the same time, the transport apparatus 1 receives a processed wafer 50b from the processing chamber 42 and transports it to another processing chamber, e.g., the processing chamber 43 by performing the above operation.

Then, the transport apparatus 1 brings out and hands over the unprocessed wafer 50a and the processed wafer 50b between the processing chamber 42 to 44, the loading chamber 45, and the unloading chamber 46.

According to the present embodiment having the above configuration, the semiconductor manufacturing system that can be installed in a small area is obtained.

The present invention is not limited to the aforementioned embodiments but various modifications can be made.

For example, the parallel four-bar link mechanism is used as each of the first and second link mechanisms in the aforementioned embodiments. However, the present invention is not limited thereto. Another link mechanism may be employed.

From viewpoints of reduction of the rotation radius and reduction of the number of the components, it is preferable to use the parallel four-bar link mechanism described above.

In addition, pulleys and a belt are used in the dead point escape mechanism in the aforementioned embodiments. The belt may be replaced with a wire. Moreover, chain and a sprocket may be used.

What is claimed is:

1. A transport apparatus comprising:
   a first driving shaft, a second driving shaft, and a third driving shaft each independently movable about a predetermined coaxial axis and each being coupled to a respective drive mechanism, whereby rotations of the first through third driving shafts are independently controlled, respectively,
   a first driving arm, a second driving arm, and a third driving arm fixed to the first through third driving shafts, respectively,
   a first link mechanism consisting of the first and the third driving arms among the first through third driving arms and a pair of first driven arms that are directly connected to the first and the third driving arms, a first transport unit connected to the first driven arms for transporting an object to be transported;

a second link mechanism consisting of the second and the third driving arms among the first through third driving arms and a pair of second driven arms that are directly connected to the second and third driving arms, and a second transport unit connected to the second driven arms for transporting an object to be transported;

wherein the pair of first driven arms with the first transport unit are rotatably coupled together in a horizontal plane above the first through third driving shafts, wherein the pair of second driven arms with the second transport unit are rotatably coupled together in a horizontal plane above the pair of first driven arms and the first transport unit, and one of the pair of second driven arms is rotatably coupled in the horizontal plane to a top end of the second driving arm which is formed in shape so that the top end of the second driving arm can be placed above the pair of first driven arms and the first transport unit, wherein each of the first through third driving arms has a same length, the length being from an axis of the rotary shafts to a connection of the respective arm to any of the driven arms.

2. The transport apparatus according to claim 1, wherein each of the first and second link mechanisms constitutes a respective parallel four-bar link mechanism that operates in a horizontal direction, and comprising a dead point escape mechanism for allowing that link mechanism to pass through a dead point at which an angle formed by the paired arms of that link mechanism is 180 degrees.

3. The transport apparatus as recited in claim 1, further comprising: a vertical moving mechanism for moving the first and second link mechanisms in a vertical direction.

4. The transport apparatus as recited in claim 1, wherein the driving means further comprises:

permanent magnets arranged at predetermined positions of the first, second, and third driving shafts, respectively; and electromagnetic stators provided to correspond to the respective permanent magnets, and the driving means is configured to supply driving currents to the electromagnetic stators based on predetermined information.

5. The transport apparatus as recited in claim 1, wherein the driving means comprises angle sensors for detecting angles of rotation of the first, second, and third driving shafts, respectively, and the driving means is configured to control the rotation of each of the first, second, and third driving shafts based on the result obtained by the angle sensors.

6. A method for controlling a transport apparatus, the transport apparatus comprising:

a first driving shaft, a second driving shaft and a third driving shaft each independently movable about a predetermined coaxial axis and each being coupled to a respective drive mechanism, whereby rotations of the first through third driving shafts are independently controlled, respectively, a first driving arm, a second driving arm, and a third driving arm fixed to the first through third driving shafts, respectively, a first link mechanism consisting of the first and the third driving arms among the first through third driving arms and a pair of first driven arms that are directly connected to the first and the third driving arms, a first transport unit connected to the first driven arms for transporting an object to be transported;

a second link mechanism consisting of the second and the third driving arms among the first through third driving arms and a pair of second driven arms that are directly connected to the second and third driving arms, and a second transport unit connected to the second driven arms for transporting an object to be transported;

wherein the pair of first driven arms with the first transport unit are rotatably coupled together in a horizontal plane above the first through third driving shafts, wherein the pair of second driven arms with the second transport unit are rotatably coupled together in a horizontal plane above the pair of first driven arms and the first transport unit, and one of the pair of second driven arms is rotatably coupled in the horizontal plane to a top end of the second driving arm which is formed in shape so that the top end of the second driving arm can be placed above the pair of first driven arms and the first transport unit, wherein each of the first through third driving arms has a same length, the length being from an axis of the rotary shafts to a connection of the respective arm to any of the driven arms;

the method comprising the step of rotating the first, the second and the third driving around the coaxial rotary shaft in the same direction by the same angle, thereby rotating the first and second transport units around the coaxial rotary shaft.

7. The method for controlling a transport apparatus according to claim 6, further comprising the step of rotating a pair of the driving arms of one of the first and second link mechanisms around the coaxial rotary shaft in opposite directions to each other by the same angle and rotating a pair of the driving arms of the other link mechanism around the coaxial rotary shaft in the same direction by the same angle to move one of the first 6and second transport units toward a straight line passing through the coaxial rotary shaft.

8. The method for controlling a transport apparatus according to claim 6, further comprising the step of, when the first and second transport units are allowed to move to a rotatable region, rotating the pairs of the driving arms of each of the first and second link mechanisms around the coaxial rotary shaft in opposite directions to each other by the same angle to move the first and second transport units toward the rotatable region, and, when one of the first and second transport units has reached the rotatable region, rotating the pair of the driving arms of the link mechanism including a reaching transport unit around the coaxial rotary shaft in the same direction by the same angle in order to rotate the reaching transport unit around coaxial rotary shaft in the rotatable region and rotating the pair of the driving arms of the other link mechanism including a non-reaching transport unit around the coaxial rotary shaft in opposite directions to each other by the same angle to further move the other transport unit toward the rotatable region.

9. A vacuum processing system comprising the transport apparatus according to claim 1; and a transport chamber having the transport apparatus; and at least one vacuum processing chamber that is connected with the transport chamber and is configured to receive an object to be processed from the transport apparatus and hand it over to the transport apparatus.

10. The transport apparatus according to claim 1, wherein the one of the first driven arms is directly connected to one of the second driven arms at a common pivot point at a distance from the coaxial axis.

11. The transport apparatus according to claim 1, wherein the one of the first driven arms is connected to one of the second driven arms indirectly, by both of the arms being coupled to the third driving arm at respective distances from the coaxial axis.

12. The method according to claim 6, wherein the one of the first driven arms is directly connected to one of the second driven arms at a common pivot point at a distance from the coaxial axis.

13. The method according to claim 6, wherein the one of the first driven arms is connected to one of the second driven arms indirectly, by both of the arms being coupled to the third driving arm at respective distances from the coaxial axis.

* * * * *